US007916520B2

(12) United States Patent
Sugibayashi et al.

(10) Patent No.: US 7,916,520 B2
(45) Date of Patent: Mar. 29, 2011

(54) MEMORY CELL AND MAGNETIC RANDOM ACCESS MEMORY

(75) Inventors: Tadahiko Sugibayashi, Tokyo (JP);
Takeshi Honda, Tokyo (JP); Noboru Sakimura, Tokyo (JP); Tetsuhiro Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 433 days.

(21) Appl. No.: 11/574,121

(22) PCT Filed: Aug. 19, 2005

(86) PCT No.: PCT/JP2005/015122
§ 371 (c)(1),
(2), (4) Date: Oct. 10, 2007

(87) PCT Pub. No.: WO2006/022197
PCT Pub. Date: Mar. 2, 2006

(65) Prior Publication Data
US 2008/0089117 A1    Apr. 17, 2008

(30) Foreign Application Priority Data
Aug. 25, 2004    (JP) .................................. 2004-245648

(51) Int. Cl.
*G11C 11/00* (2006.01)
(52) U.S. Cl. ..... 365/158; 365/171; 365/148; 365/222.5; 365/243.5; 977/935
(58) Field of Classification Search .................. 365/148, 365/158, 48, 55, 62, 66, 74, 78, 80–93, 100, 365/130, 131, 171–173, 225.5, 243.5; 257/421, 257/E21.665; 438/3; 977/933, 934, 935; 216/22
See application file for complete search history.

(56) References Cited

U.S. PATENT DOCUMENTS

| 6,778,427 B2 * | 8/2004 | Odagawa et al. ............. 365/158 |
| 2003/0072174 A1 * | 4/2003 | Savtchenko et al. .......... 365/158 |
| 2003/0163913 A1 * | 9/2003 | Hasegawa et al. ......... 29/603.07 |

(Continued)

FOREIGN PATENT DOCUMENTS

JP    2002-151758 A    5/2002

(Continued)

OTHER PUBLICATIONS

English Translation of JP 2004-158766 A, as per IDS and International Search Report.*

Primary Examiner — Richard Elms
Assistant Examiner — Harry W Byrne
(74) *Attorney, Agent, or Firm* — Sughrue Mion, PLLC

(57) ABSTRACT

A memory cell is used which includes a plurality of magneto-resistive elements and a plurality of laminated ferrimagnetic structure substances. The plurality of the magneto-resistive elements are placed corresponding to respective positions where a plurality of first wirings extended in a first direction intersects with a plurality of second wirings extended in a second direction which is substantially perpendicular to the first direction. The plurality of the laminated ferrimagnetic structure substances corresponds to the plurality of the magneto-resistive elements, respectively, is placed to have a distance of a predetermined range from the respective plurality of the magneto-resistive elements, and has a laminated ferrimagnetic structure. The magneto-resistive element includes a free layer having a laminated ferrimagnetic structure, a fixed layer, and a nonmagnetic layer interposed between the free layer and the fixed layer.

19 Claims, 17 Drawing Sheets

U.S. PATENT DOCUMENTS

| | | | |
|---|---|---|---|
| 2004/0047190 A1* | 3/2004 | Odagawa et al. | 365/200 |
| 2004/0085807 A1* | 5/2004 | Hiramoto et al. | 365/145 |
| 2004/0115839 A1* | 6/2004 | Sugita et al. | 438/3 |
| 2006/0244021 A1* | 11/2006 | Klostermann et al. | 257/295 |

FOREIGN PATENT DOCUMENTS

| | | |
|---|---|---|
| JP | 2002-353535 A | 12/2002 |
| JP | 2003-110164 A | 4/2003 |
| JP | 2003-298023 A | 10/2003 |
| JP | 2004-157766 A | 6/2004 |
| JP | 2004-158766 A | 6/2004 |
| JP | 2005-142508 A | 6/2005 |

* cited by examiner

RELATED ART

MEMORY CELL AND MAGNETIC RANDOM ACCESS MEMORY

This application claims priority from PCT Application No. PCT/JP2005/015122 filed Aug. 19, 2005 and from Japanese Patent Application No. 2004-245648 filed Aug. 25, 2004, which applications are incorporated herein by reference.

TECHNICAL FIELD

The present invention relates to a memory cell and a magnetic random access memory, particularly to a magnetic random access memory using a memory cell which includes a tunnel magneto-resistive element.

BACKGROUND ART

There is known a magnetic random access memory (hereinafter, referred to as an MRAM) which stores data by controlling a magnetization direction of a memory cell. There are several kinds of MRAMs depending on a method for storing the magnetization direction.

In a cited document (U.S. Pat. No. 6,545,906B), a technique of a toggle-type magnetic random access memory (hereinafter, referred to as a toggle MRAM) is disclosed. The toggle MRAM has a memory element which is a tunnel magneto-resistive element using a laminated ferri structure in a free layer. This MRAM has excellent selectivity of the memory cell at the time of a write operation, and is characterized by a point that there is almost no multiple write to occur. Details will be explained below.

FIG. 1 is a sectional view showing a structure of a conventional toggle MRAM. A magneto-resistive element 105 of a memory cell 110 in the MRMA includes an antiferromagnetic layer 104, a laminated ferri-fixed layer 103, a tunnel insulating layer 102, and a laminated ferri-free layer 101, which are laminated in this order. The laminated ferri fixed layer 103 has a laminated ferri structure, and includes a ferromagnetic layer 116, a non-ferromagnetic layer 115, and a ferromagnetic layer 114. The laminated ferri-free layer 101 has a laminated ferri structure, and includes a ferromagnetic layer 113, a non-ferromagnetic layer 112, and a ferromagnetic layer 111. The magneto-resistive element 105 is held between a write word line 126 and a bit line 127 that are mutually intersected in a substantially perpendicular state.

The laminated ferri-fixed layer 103 has a laminated ferri structure so as not to generate a magnetic field from the laminated ferri-fixed layer 103. A magnetization direction of the laminated ferri-fixed layer 103 is fixed by the antiferromagnetic layer 104. The laminated ferri-free layer 101 also has a laminated ferri structure, and the magnetic field is not generated from the laminated ferri-fixed layer 103 and the laminated ferri-free layer 101 as long as there is no external magnetic field to be applied.

FIG. 2 is an upper surface view showing a structure of a conventional toggle MRAM. Plural numbers of the write word lines 126 and the bit lines 127 are orthogonally placed (one of each is shown in FIG. 2), and the magneto-resistive element 105 is placed in each of cross points. The magneto-resistive element 105 has an easy magnetization direction (or an easy magnetization axis) which is directed at substantially 45 degrees (θ) relative to the word line 126 and the bit line 127. It is due to consideration for easiness of a toggle operation.

Next, a principle of a write operation of the conventional toggle MRAM will be explained. In the case of the toggle MRAM, data can be exclusively written from "1" to "0" or from "0" to "1". That is, it is impossible to overwrite data of "1" to "1" and "0" to "0". Therefore, a write operation of the toggle MRAM is performed by reading a selected memory cell in advance to determine whether or not a magnetization direction is changed (or whether or not toggle operation is performed) in first and second free layers based on the read information and information to write. Specifically, if the read information ("0" or "1") is equal to the information to write ("0" or "1"), a toggle operation is not performed, while a toggle operation is performed if a read operation is different from the information to write.

FIGS. 3A to 3H are views showing a principle of a toggle operation in the toggle MRAM of the conventional technique. FIG. 3A is a timing chart of a write current $I_{BL}$ flowing in the bit line 127. FIG. 3B is a timing chart of a write current $I_{WL}$ flowing in the word line 126. FIG. 3C is a time variation in a magnetization direction 121s of the ferromagnetic layer 113 and a magnetization direction 122s of the ferromagnetic layer 111 in a selected cell as the memory cell 110 into which data is written. FIG. 3D is a time variation in a direction of a magnetic field generated by the write current $I_{BL}$ and the write current $I_{WL}$. FIG. 3E is a time variation in a magnetization direction 121a of the ferromagnetic layer 113 and a magnetization direction 122a of the ferromagnetic layer 111 in a non-selected cell placed in the same bit line 127 with the selected cell. FIG. 3F is a time variation in a direction of the magnetic field generated by the write current $I_{BL}$. FIG. 3G is a time variation in a magnetization direction 121b of the ferromagnetic layer 113 and a magnetization direction 122b of the ferromagnetic layer 111 in a non-selected cell placed in the same word line 126 with the selected cell. FIG. 3H is a time variation in a direction of the magnetic field generated by the write current $I_{WL}$.

Referring to FIG. 3a, in the toggle operation, the write current $I_{BL}$ is supplied to the bit line 127 at time t2. The write current $I_{WL}$ is supplied to the word line 126 at time t3. The write current $I_{BL}$ is suspended at time t4. The write current $I_{WL}$ is suspended at time t5. Due to a series of the above current controls, a rotational magnetic field starting from a magnetic field 123, through a magnetic field 124, to a magnetic field 125 as shown in FIG. 3(d) is added to the selected cell in a cross point between the selected word line 126 provided with the write current $I_{WL}$ and the selected bit line 127 provided with the write current $I_{BL}$. Therefore, the magnetization direction 121s of the ferromagnetic layer 113 and the magnetization direction 122s of the ferromagnetic layer Ill in the selected cell are rotated (or changed) as shown in FIG. 3(c), so that data can be written. That is, data is rewritten (or toggled) into a state of "1" if an initial state is a state of "0", and into a state of "0" if the initial state is a state of "1".

At this time, a unidirectional magnetic field such as the magnetic field 123 shown in FIG. 3(f) is exclusively added to the non-selected cell in the same bit line 127 as the selected cell. Therefore, the magnetization direction 121a of the ferromagnetic layer 113 and the magnetization direction 122a of the ferromagnetic layer 111 in the non-selected cell are returned to an original state with some fluctuations as shown in FIG. 3(e), so that data is not written. Similarly, a unidirectional magnetic field such as the magnetic field 125 as shown in FIG. 3(h) is exclusively added to the non-selected cell placed in the same word line 126 as the selected cell. Therefore, the magnetization direction 121b of the ferromagnetic layer 113 and the magnetization direction 122b of the ferromagnetic layer 111 in the non-selected cell are returned to the original state with some fluctuations as shown in FIG. 3(g), so that data is not written.

FIG. 4 is a view showing a state of magnetization directions of ferromagnetic layers in an upper layer and a lower layer receiving thermal disturbance. In the case of the toggle MRAM, composite magnetization of the laminated ferri-free layer 101 approaches saturation in accordance with the increase of an applied magnetic field due to the increase of a flop magnetic field. In this case, there is a possibility of switching between magnetization of the ferromagnetic layer 111 in the upper layer and magnetization of the ferromagnetic layer 113 in a lower layer in the laminated ferri-free layer 101 caused by the thermal disturbance. There is a demand for a technique which uses a write magnetic field to prevent composite magnetization from approaching saturation and to suppress a possibility of switching between magnetization of the ferromagnetic layer in the upper layer and magnetization of the ferromagnetic layer in the lower layer due to the thermal disturbance. Here, it is assumed that the flop magnetic field is the magnetic field in a boundary between a region with a nonlinear change and a region with a linear change in magnetization of the laminated ferri-free layer 101 with respect to the magnetic field.

As a related technique, Japanese Laid Open Patent Application JP-P2004-158766A discloses a technique of a magneto-resistive effect element and a magnetic memory device. The magneto-resistive effect element has a first magnetization fixed layer, a first tunnel barrier layer, a first ferromagnetic layer, a magnetization free layer including a nonmagnetic layer and a second ferromagnetic layer, a second tunnel barrier layer, and a second magnetization fixed layer. The first and second magnetization fixed layers have magnetization directions that are opposite from each other, The first ferromagnetic layer and the second ferromagnetic layer are antiferromagnetically coupled via the nonmagnetic layer. One of the first and second ferromagnetic layers has magnetization which is larger than magnetization of the other one. One of the first and second magnetization fixed layers has magnetization which is larger than the magnetization of the other one. The magnetization fixed layer with larger magnetization is formed in a side closer to the ferromagnetic layer with smaller magnetization among the first and second ferromagnetic layers.

As a related technique, Japanese Laid Open Patent Application JP-P2003-298023A discloses a technique of a magnetic memory and a magnetic memory device. The magnetic memory includes first and second magneto-resistive effect elements to be mutually opposed, a common wiring interposed between the first and second magneto-resistive effect elements, a first wiring which intersects the common wiring by holding the first magneto-resistive effect element therebetween, and a second wiring which intersects the common wiring by holding the second magneto-resistive effect element therebetween. The first magneto-resistive effect element has a first pin layer and a first free layer. The first pin layer includes a laminated substance of laminating even-numbered ferromagnetic layers via the nonmagnetic layer, and maintains a magnetization direction at the time of applying a first magnetic field which is generated by causing a write current to flow in the common wiring and the first wiring. The first free layer includes a laminated substance which is interposed between the first pin layer and the common wiring and laminates one ferromagnetic layer or a plurality of ferromagnetic layers via the nonmagnetic layer, and has a reversible magnetization direction when the first magnetic field is applied. The second magneto-resistive effect element has a second pin layer and a second free layer. The second pin layer includes a laminated substance of laminating one ferromagnetic layer or odd-numbered ferromagnetic layers of three or more via the nonmagnetic layer, and maintains a magnetization direction at the time of applying a second magnetic field which is generated by causing a write current to flow in the common wiring and the second wiring. The second free layer includes a laminated substance which is interposed between the second pin layer and the common wiring and laminates one ferromagnetic layer or a plurality of ferromagnetic layers via the nonmagnetic layer, and has a reversible magnetization direction when the second magnetic field is applied. The number of the ferromagnetic layers included in the first free layer and the number of the ferromagnetic layers included in the second free layer are odd numbers in both or even numbers in both.

As a related technique, Japanese Laid Open Patent Application JP-P2003-110164A discloses a technique of a magneto-resistive effect element, a magnetic memory and a magnetic head. The magneto-resistive effect element has a magnetic laminated film, a ferromagnetic substance film, and an insulating film arranged between the magnetic laminated film and the ferromagnetic substance film. Disclosed is the magneto-resistive effect element of a tunnel junction type, in which a current is made to flow between the magnetic laminated film and the ferromagnetic substance film by tunneling the insulating film. The magnetic laminated film has a first ferromagnetic substance layer, a second ferromagnetic substance layer, and an antiferromagnetic substance layer inserted between the first and second ferromagnetic substance layers.

As a related technique, Japanese Laid Open Patent Application JP-P2002-353535A discloses a technique of a magneto-resistive effect element, a magneto-resistive effect type magnetic sensor, a magneto-resistive effect type magnetic head, and a magnetic memory. The magneto-resistive effect element has a laminated structure unit of laminating at least a free layer with magnetization to be rotated in accordance with the external magnetic field, a fixed layer, an antiferromagnetic layer for fixing magnetization of the fixed layer, and a nonmagnetic layer interposed between the free layer and the fixed layer. Disclosed is a giant magneto-resistive effect element, in which a substantial lamination direction of the laminated structure unit is made to be an energizing direction of a sense current. Arranged in the laminated structure unit is an energizing control layer to dispersedly form micro energized regions across a path of the sense current.

As a related technique, Japanese Laid Open Patent Application JP-P2002-151758A discloses a technique of a ferromagnetic tunnel magneto-resistive effect element, a magnetic memory, and a magneto-resistive effect type head. The ferromagnetic tunnel magneto-resistive effect element has a tunnel barrier layer which is formed between a first magnetic layer and a multi-layer structure of laminating at least five or more layers including a ferromagnetic layer and an intermediate layer. The first magnetic layer has a magnetization direction restricted to an acting external magnetic field. The ferromagnetic layer to compose the multi-layer structure has a magnetization direction rotated to the external magnetic field, in which magnetization is antiferromagnetically arranged via the intermediate layer. The ferromagnetic tunnel magneto-resistive effect element has a ferromagnetic tunnel magneto-resistive effect film having resistance changed by a relative angle of magnetization in the first magnetic layer and the ferromagnetic layers to compose the multi-layer structure, lower and upper electrodes to be electrically connected to lower and upper magnetic layers in order to provide a sense current for the ferromagnetic tunnel magneto-resistive effect film, and a detection means adapted to detect a resistance change.

DISCLOSURE OF INVENTION

An object of the present invention is to provide a memory cell and a magnetic random access memory to use a write magnetic field for preventing the composite magnetization from approaching saturation, and for suppressing a possibility of switching between the magnetization of the ferromagnetic layer in the upper layer and the magnetization of the ferromagnetic layer in a lower layer in a free layer having a laminated ferrimagnetic structure due to the thermal disturbance.

Another object of the present invention is to provide a memory cell and a random access memory that are highly reliable, highly yielding and inexpensive.

These objects of the present invention and another object and profit can be easily confirmed by explanation below and accompanying drawings.

Accordingly, in order to solve the above problems, a memory cell according to the present invention includes a plurality of magneto-resistive elements and a plurality of laminated ferrimagnetic structure substances. The plurality of the magneto-resistive elements are placed corresponding to respective positions where a plurality of first wirings extended in a first direction intersects with a plurality of second wirings extended in a second direction which is substantially perpendicular to the first direction. The plurality of the laminated ferrimagnetic structure substances corresponds to the plurality of the magneto-resistive elements respectively, is placed to have a distance of a predetermined range from the respective magneto-resistive elements, and has a laminated ferrimagnetic structure. The magneto-resistive element includes a free layer having a laminated ferrimagnetic structure, a fixed layer, and a nonmagnetic layer interposed between the free layer and the fixed layer.

In the memory cell as described above, the laminated ferrimagnetic structure substance adjusts the magnitude of the magnetic field which acts on the free layer, so that the composite magnetization can be prevented from approaching saturation. Therefore, the possibility of switching between the magnetization of the ferromagnetic layer in the upper layer and the magnetization of the ferromagnetic layer in the lower layer in the free layer due to the thermal disturbance can be suppressed. Here, the distance of the predetermined range shall be a distance in which a magnetic coupling cannot be generated between the laminated ferrimagnetic structure substance and the free layer (a coupling constant is substantially 0), and a magnetic field of the laminated ferrimagnetic structure substance magnetized at the time of the write operation can act.

In the above described memory cell, a data is written into the magneto-resistive element by a magnetic field larger than a flop magnetic field of the free layer.

It is possible in the memory cell as described above to securely write data.

In the above described memory cell, a flop magnetic field of the laminated ferrimagnetic structure substance is preferably larger than the flop magnetic field of the free layer when the laminated ferrimagnetic structure substance is placed in the same direction as the free layer with respect to the first wiring and the second wiring.

If the magnetic field applied to the memory cell exceeds the flop magnetic field of the laminated ferrimagnetic structure substance, the memory cell as described above is capable of suppressing the magnetic field so as to decrease an effective magnetic field. Therefore, the magnitude of a magnetic field which acts on the free layer can be adjusted.

In the above described memory cell, the flop magnetic field of the laminated ferrimagnetic structure substance is preferably smaller than a saturation magnetic field of the free layer.

The memory cell as described above is capable of suppressing the magnetic field applied to the memory cell before the magnetic field reaches the saturation magnetic field. Therefore, the magnitude of the magnetic field which acts on the free layer can be appropriately adjusted.

In the above described memory cell, the free layer includes a first magnetic layer formed by a ferromagnetic substance, a second magnetic layer formed by a ferromagnetic substance, and a first nonmagnetic layer which is interposed between the first magnetic layer and the second magnetic layer and has a film thickness so as to antiferromagnetically couple the first magnetic layer and the second magnetic layer. The laminated ferrimagnetic structure substance includes a third magnetic layer formed by the ferromagnetic substance, a fourth magnetic layer formed by the ferromagnetic substance, and a second nonmagnetic layer which is interposed between the third magnetic layer and the fourth magnetic layer and has a film thickness so as to antiferromagnetically couple the third magnetic layer and the fourth magnetic layer. The same materials are preferably used in configurations between the first magnetic layer and the third magnetic layer, between the second magnetic layer and the fourth magnetic layer, and between the first nonmagnetic layer and the second nonmagnetic layer, respectively.

The memory cell as described above has a manufacturing process of the free layer which can be used for manufacturing the laminated ferrimagnetic structure substance, so that stable manufacturing can be achieved.

In the above described memory cell, a film thickness of the first nonmagnetic layer is larger than a film thickness of the second nonmagnetic layer.

The memory cell as described above allows the flop magnetic field of the laminated ferrimagnetic structure substance to be made larger than the flop magnetic field of the free layer.

In the above described memory cell, a magnetization saturation magnetic field of the laminated ferrimagnetic structure substance is preferably smaller than a magnetization saturation magnetic field of the free layer when the laminated ferrimagnetic structure substance is placed in an opposite direction of the free layer with respect to the first wiring and the second wiring.

If the magnetic field applied from the laminated ferrimagnetic structure substance to the memory cell is strengthened, the memory cell as described above is capable of suppressing a strengthening effect in a magnetic field which exceeds the magnetization saturation magnetic field of the laminated ferrimagnetic structure substance. Therefore, the magnitude of the magnetic field which acts on the free layer can be more appropriately adjusted.

In the above described memory cell, the free layer includes a first magnetic layer formed by the ferromagnetic substance, a second magnetic layer formed by the ferromagnetic substance, and a first nonmagnetic layer which is interposed between the first magnetic layer and the second magnetic layer and has the film thickness so as to antiferromagnetically couple the first magnetic layer and the second magnetic layer. The laminated ferrimagnetic structure substance includes a third magnetic layer formed by the ferromagnetic substance, a fourth magnetic layer formed by the ferromagnetic substance, and a second nonmagnetic layer which is interposed between the third magnetic layer and the fourth magnetic layer and has a film thickness so as to antiferromagnetically couple the third magnetic layer and the fourth magnetic layer. The same materials are preferably used in configurations between the first magnetic layer and the third magnetic layer, between the second magnetic layer and the fourth magnetic layer, and between the first nonmagnetic layer and the second nonmagnetic layer, respectively.

The memory cell as described above has a manufacturing process of the free layer which can be used for manufacturing the laminated ferrimagnetic structure substance, so that stable manufacturing can be achieved.

In the above described memory cell, a film thickness of the second nonmagnetic layer is preferably larger than a film thickness of the first nonmagnetic layer.

In the memory cell as described above, it is possible to set the saturation magnetic field of the laminated ferrimagnetic structure substance to be sufficiently smaller than the saturation magnetic field of the free layer.

Accordingly, in order to solve the above problems, the magnetic random access memory according to the present invention includes a plurality of first wrings, a plurality of second wiring, and a plurality of memory cells. The plurality of the first wirings is extended in a first direction. The plurality of the second wirings is extended in a second direction which is substantially perpendicular to the first direction. The plurality of the memory cells is placed corresponding to positions where the plurality of first wirings intersects with the plurality of second wirings respectively, and described in any one of the above paragraphs. A magneto-resistive element of the memory cell has an easy magnetization axis direction which is different from the first direction and the second direction.

In the magnetic random access memory as described above, the laminated ferrimagnetic structure substance adjusts the magnitude of the magnetic field which acts on the free layer, so that the composite magnetization can be prevented from approaching saturation. Therefore, the possibility of switching between the magnetization of the ferromagnetic layer in the upper layer and the magnetization of the ferromagnetic layer in the lower layer in the free layer due to the thermal disturbance can be suppressed.

In the above described magnetic random access memory, it is preferable that an angle made between the easy magnetization axis direction and the first direction is substantially 45 degrees.

The magnetic random access memory as described above is capable of more appropriately performing the toggle operation.

According to the present invention, a write magnetic field allows to prevent composite magnetization having a laminated ferrimagnetic structure from approaching saturation, and to suppress the possibility of switching between the magnetization of the ferromagnetic layer in the upper layer and the magnetization of the ferromagnetic layer in the lower layer in the free layer due to the thermal disturbance

BEST MODE FOR CARRYING OUT THE INVENTION

Embodiments of a memory cell and a magnetic random access memory according to the present invention will be explained below referring to accompanying diagrams.

First Embodiment

A first embodiment of a memory cell and a magnetic random access memory (MRAM) according to the present invention will be explained referring to accompanying drawings.

Figure 1:
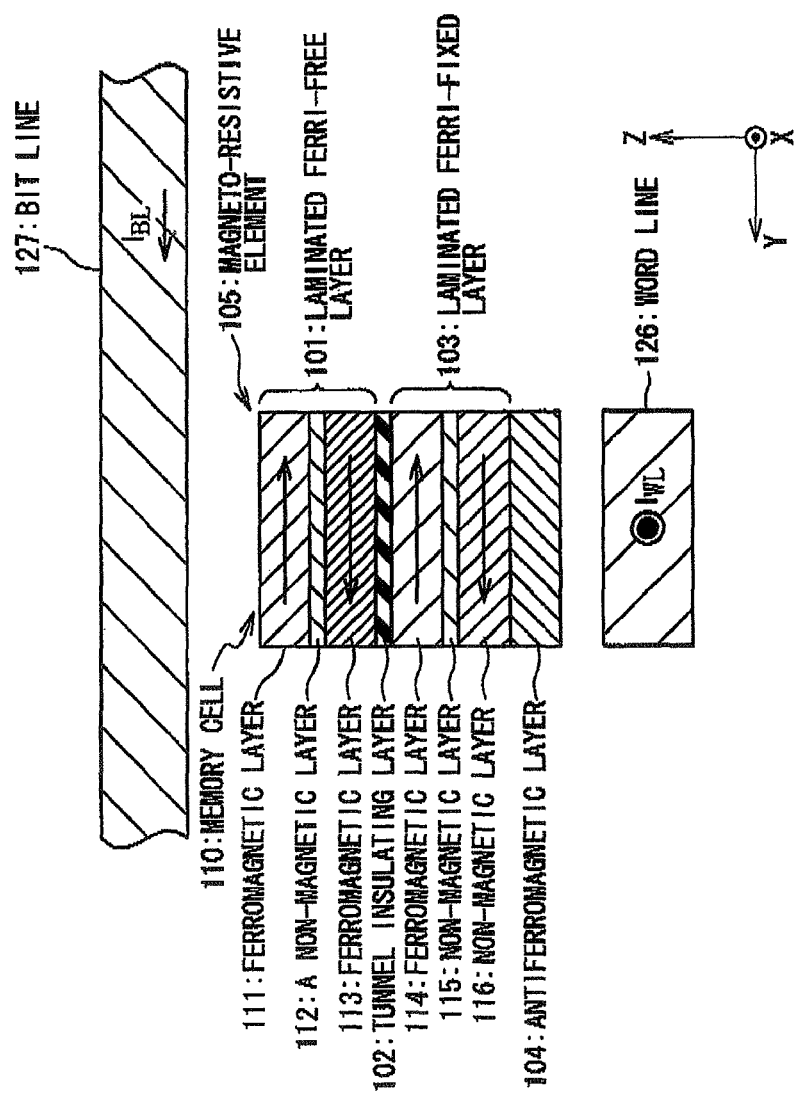
FIG. 1 is a sectional view showing a structure of a conventional toggle MRAM.
Figure 2:
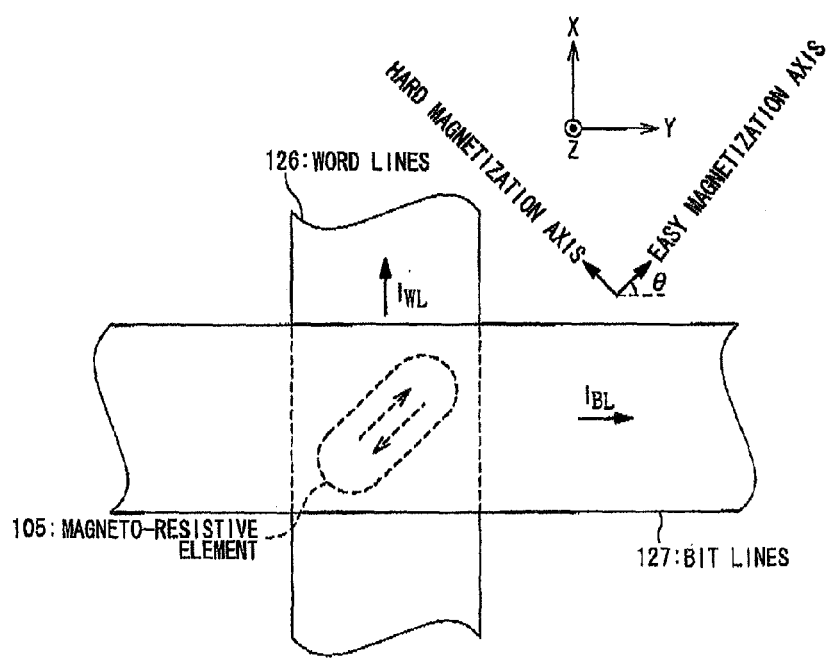
FIG. 2 is an upper surface view showing the structure of the conventional toggle MRAM.
Figure 3:
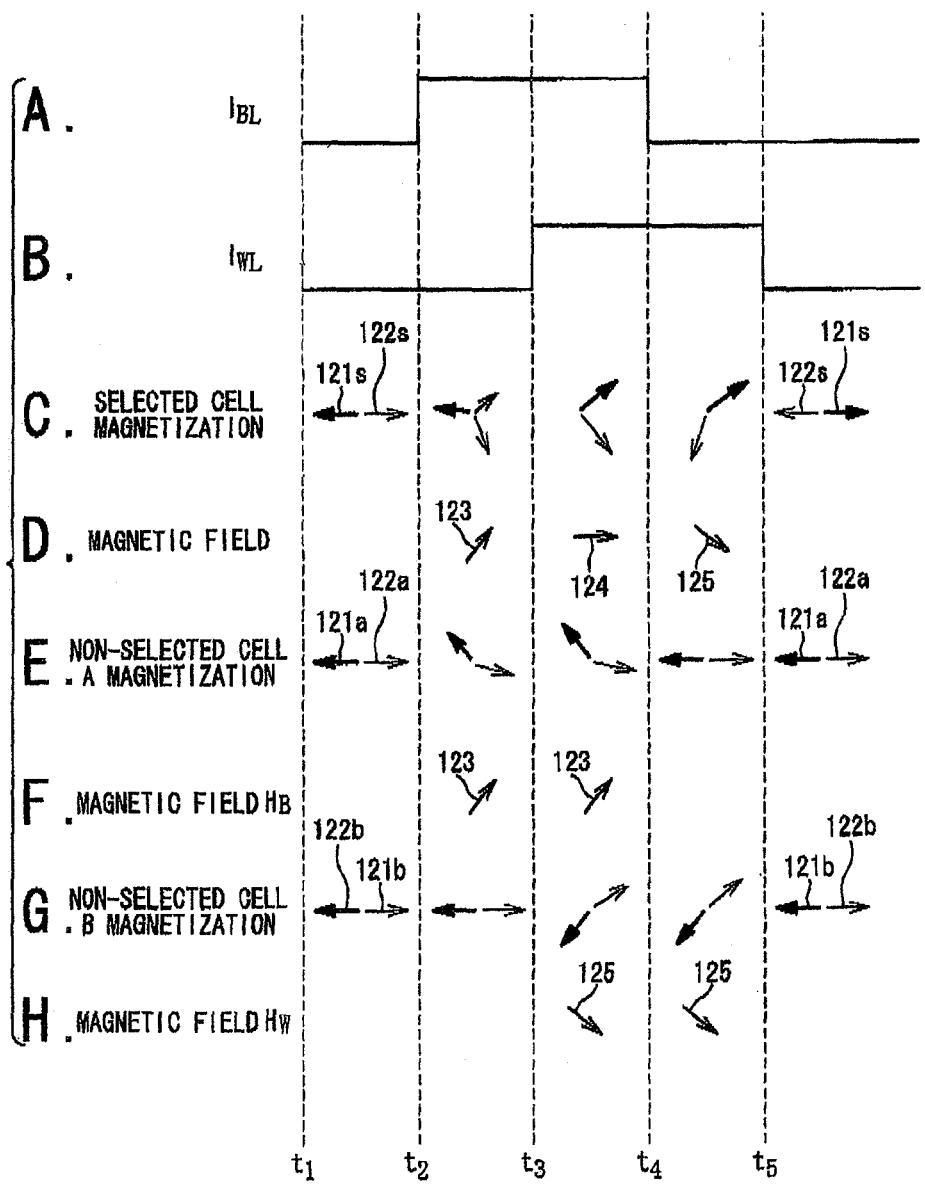
FIGS. 3A to 3H are views showing a principle of a toggle operation in the toggle MRAM of the conventional technique.
Figure 4:
FIG. 4 is a view showing a state of magnetization directions of ferromagnetic layers in an upper layer and a lower layer receiving thermal disturbance.
Figure 5:
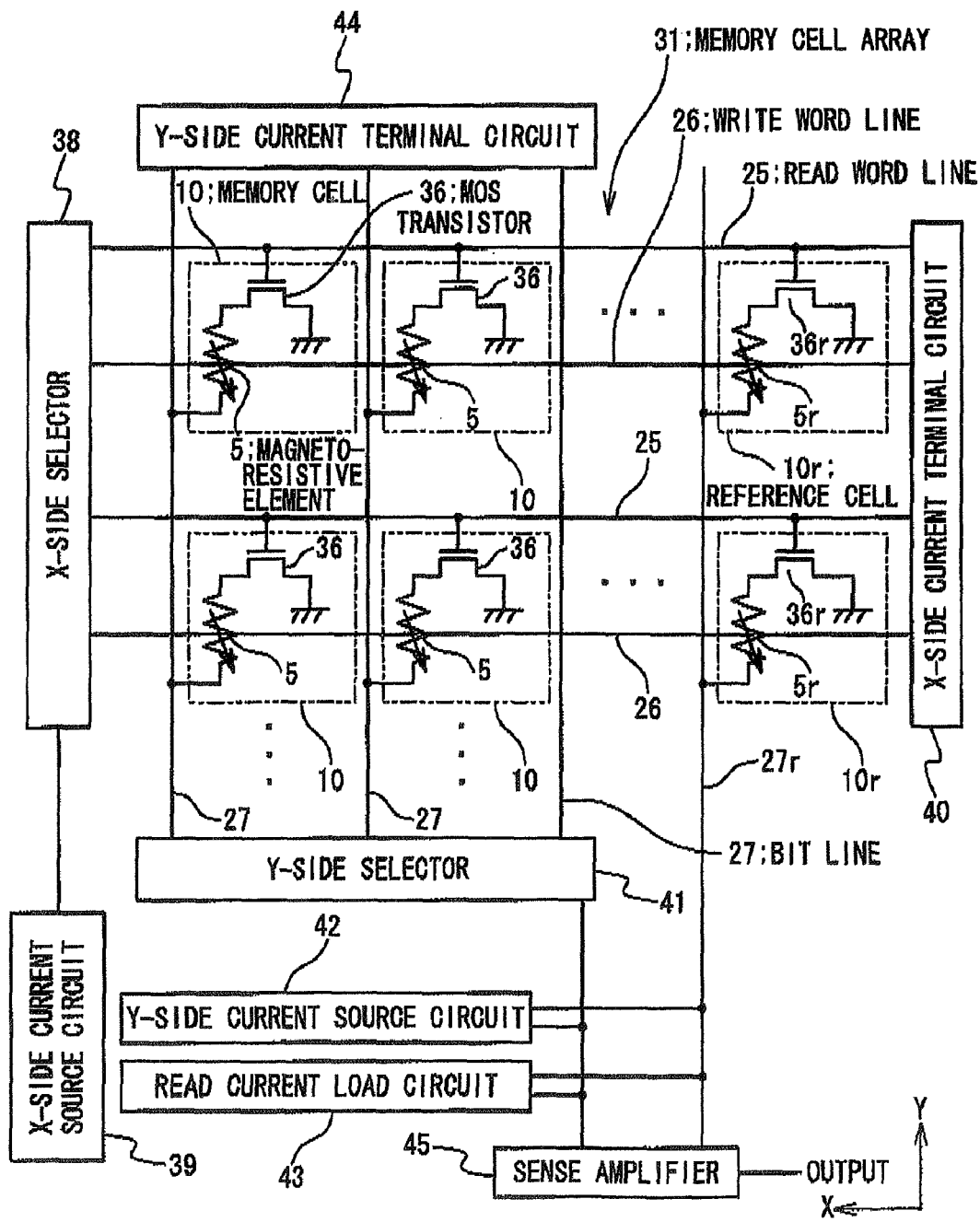
FIG. 5 is a block diagram showing a configuration of a first embodiment of an MRAM according to the present invention.

First, a configuration of the first embodiment of the MRAM will be explained, to which the memory cell is applied according to the present invention. FIG. 5 is a block diagram showing the configuration of the first embodiment of the MRAM to which the memory cell is applied according to the present invention. The MRAM includes a memory cell array 31, a plurality of write word lines 26, a plurality of read word lines 25, a pluarlity of bit lines 27, an X-side selector 38, an X-side current source circuit 39, an X-side current terminal circuit 40, a Y-side selector 41, a Y-side current source circuit 42, a read current load circuit 43, a Y-side current terminal circuit 44, and a sense amplifier 45.

The memory cell array 31 includes memory cells 10 that are placed in a matrix state. The X-side selector 38 selects a desired selected read word line 25s at the time of the read operation and selects a desired selected write word line 26s at the time of the write operation among the plurality of the read word lines 25 and the plurality of the write word lines 26 that are extended in an X axis direction, The X-side current source circuit 39 supplies a constant current at the time of the write operation. The X-side current terminal circuit 40 terminates the plurality of the write word lines 26. The Y-side selector 41 selects a desired selected bit line 27s among the plurality of the bit lines 27 extended in a Y axial direction. At the time of the read operation, the read current load circuit 43 supplies a predetermined current to a selected memory cell (selected cell 10s) and a memory cell (reference cell 10r) for a reference cell. The Y-side current terminal circuit 44 terminates the plurality of the bit lines 27. The sense amplifier 45 outputs data of the selected cell 10s on the basis of the difference between a voltage of a bit line 27r for reference connected to the reference cell 10r and a voltage of the bit line 27 connected to the selected cell 10s.

The memory cell 10 is placed corresponding to a cross point made by the read word line 25, the write word line 26 and the bit line 27. The memory cell 10 includes an MOS transistor 36 to be simultaneously turned on at the time of selecting the memory cell 10 and a magneto-resistive element 5 that are connected in series. Since the magneto-resistive element 5 has an effective resistance value which is changed depending on 1 and 0 of data (R and R+ΔR), it is indicated as a variable resistor. It is omitted in FIG. 5 to show a laminated ferrimagnetic structure substance 8 to be described below.

Figure 6:
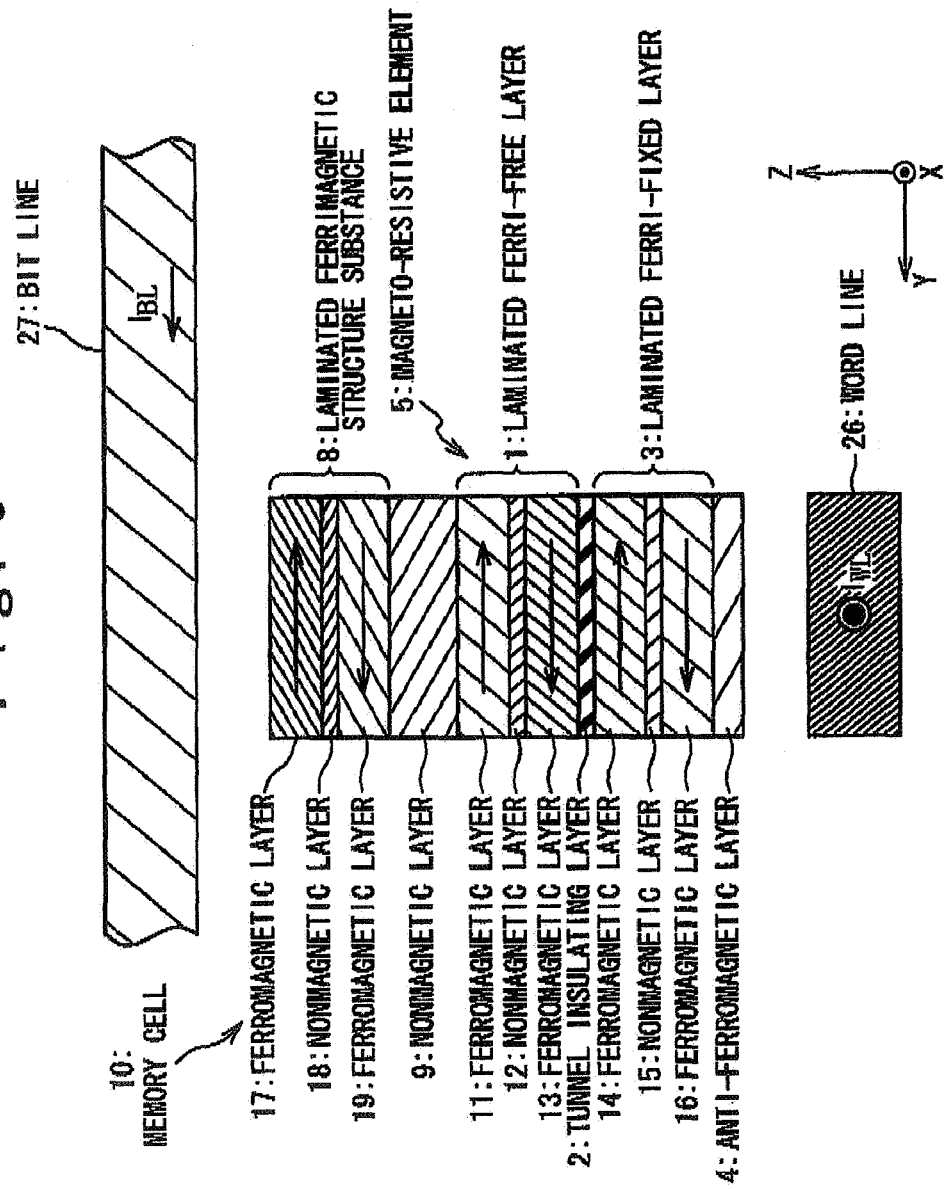
FIG. 6 is a sectional view showing the vicinity of a memory cell in the MRAM of FIG. 5.

FIG. 6 is a sectional view showing the vicinity of the memory cell in the MRAM of FIG. 5. The magneto-resistive element 5 of the memory cell 10 has a laminated structure in which an anti-ferromagnetic layer 4, a laminated ferri-fixed layer 3, a tunnel insulating layer 2 and a laminated ferri-free layer 1 are laminated in this order. The laminated ferri-fixed layer 3 has a laminated ferri structure. The laminated ferri-fixed layer 3 includes a laminated structure in which a ferromagnetic layer 16, a nonmagnetic layer 15, and a ferromagnetic layer 14 are laminated in this order. The laminated ferri-free layer 1 has a laminated ferri structure. The laminated ferri-free layer 1 includes a laminated structure in which a ferromagnetic layer 13, a nonmagnetic layer 22, a ferromagnetic layer 12, a nonmagnetic layer 21, and a ferromagnetic layer 11 are laminated in this order. The magneto-resistive element 5 is placed between the write word line 26 and the bit line 27 that are substantially orthogonal from each other via an interlayer insulating layer (not shown).

A nonmagnetic layer 9 and the laminated ferrimagnetic structure substance 8 (hereinafter, also referred to as a shielder) are laminated in this order on the laminated ferri-free layer 1 between the magneto-resistive element 5 and the bit line 27. A film thickness of the nonmagnetic layer 9 is set so as not to cause a magnetic coupling between the laminated ferri-free layer 1 and the laminated ferrimagnetic structure substance 8. The laminated ferrimagnetic structure substance 8 has a laminated ferri structure (or a laminated ferrimagnetic structure). The laminated ferrimagnetic structure substance 8 includes a laminated structure in which a ferromagnetic layer 19, a nonmagnetic layer 18 and a ferromagnetic layer 17 are laminated in this order.

Figure 7:
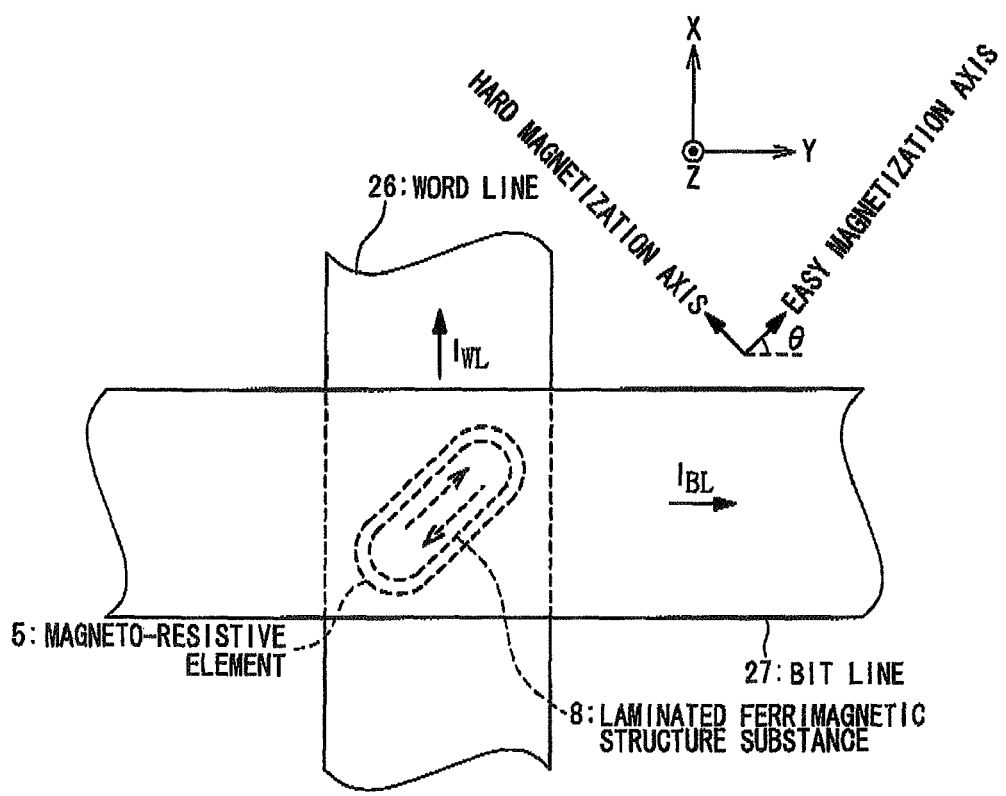
FIG. 7 is an upper surface view showing the structure of the MRAM according to the present invention.

FIG. 7 is an upper surface view showing a structure of the MRAM according to the present invention. The magneto-resistive element 5 has the easy magnetization axis which is directed at substantially 45 degrees (θ) with respect to the word line 26 and the bit line 27. It is due to consideration for easiness of the toggle operation. The laminated ferrimagnetic structure substance 8 on the magneto-resistive element 5 has a sectional structure which is substantially the same as that of the magneto-resistive element 5 when it is seen from a top surface. It is preferable in enhancement of a magnetic effect with respect to the magneto-resistive element 5.

Figure 8:
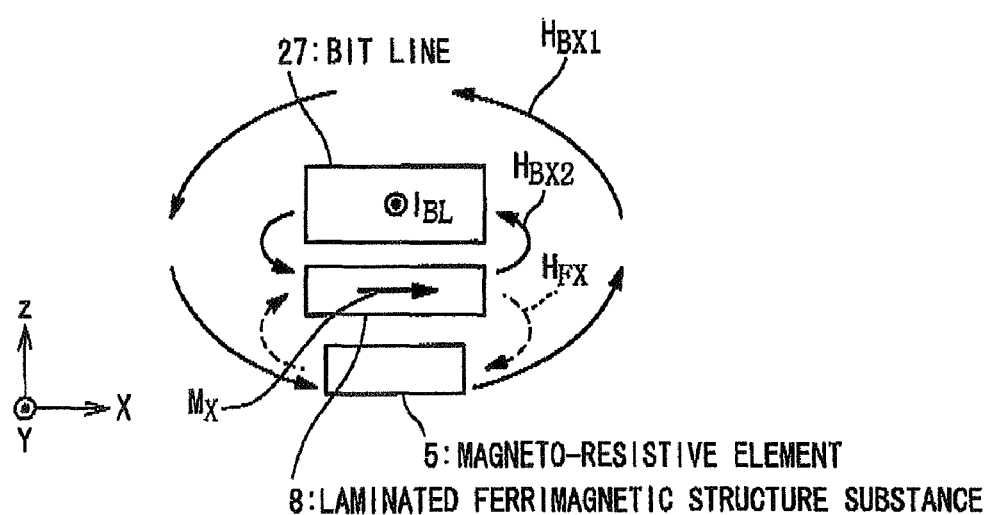
FIG. 8 is a view exemplifying a state of a magnetic field which acts on a magneto-resistive element 5.

FIG. 8 is a diagram exemplifying a state of the magnetic field which acts on the magneto-resistive element. The laminated ferrimagnetic structure substance 8 is placed in the same direction (or the same side) as the magneto-resistive element 5 with respect to the bit line 27 and the word line 26 (refer to FIG. 6). The laminated ferrimagnetic structure substance 8 acts to weaken a magnetic field applied to the magneto-resistive element 5 when a current $I_{BL}$ flowing in the bit line 27 and a current $I_{WL}$ flowing in the word line 26 are made to flow at the time of the write operation, As shown in FIG. 8, the current $I_{BL}$ flowing in the bit line 27 in a +Y direction causes a magnetic field $H_{B \times 1}$ to be applied in a +X direction to the magneto-resistive element 5. Furthermore, the current $I_{BL}$ causes a magnetic field $H_{B \times 2}$ to be applied in the +X direction to the laminated ferrimagnetic structure substance 8 provided corresponding to the magneto-resistive element 5. Due to the application of the magnetic field $H_{B \times 2}$, magnetization M is induced in the laminated ferrimagnetic structure substance 8 in the +X direction. The magnetization $M_X$ induced in the laminated ferrimagnetic structure substance 8 causes a magnetic field $H_{FX}$ to be applied to the magneto-resistive element 5. If the magneto-resistive element 5 and the laminated ferrimagnetic structure substance 8 are placed in the same side of the bit line 27, the magnetic field $H_{FX}$ is applied in a −X direction which is opposite to the magnetic field $H_{B \times 1}$. Accordingly, the laminated ferrimagnetic structure substance 8 acts to weaken the magnetic field applied to the magneto-resistive element 5 when the current $I_{BL}$ is made to flow in the bit line 27. According to similar consideration, it is understood that the laminated ferrimagnetic structure substance 8 acts to weaken the magnetic field applied to the magneto-resistive element 5 when the current $I_{WL}$ is made to flow in the word line 26.

Figure 9:
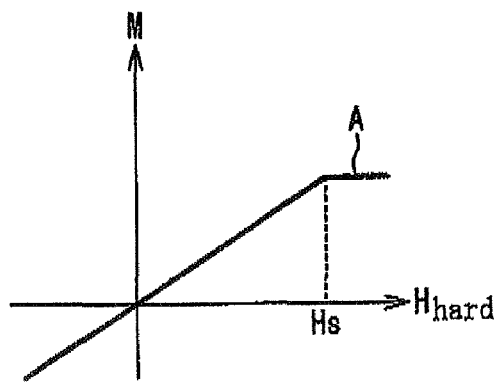
FIG. 9 is a graph showing magnetization characteristics with respect to an external magnetic field $H_{hard}$ in a hard magnetization axis direction.
Figure 10:
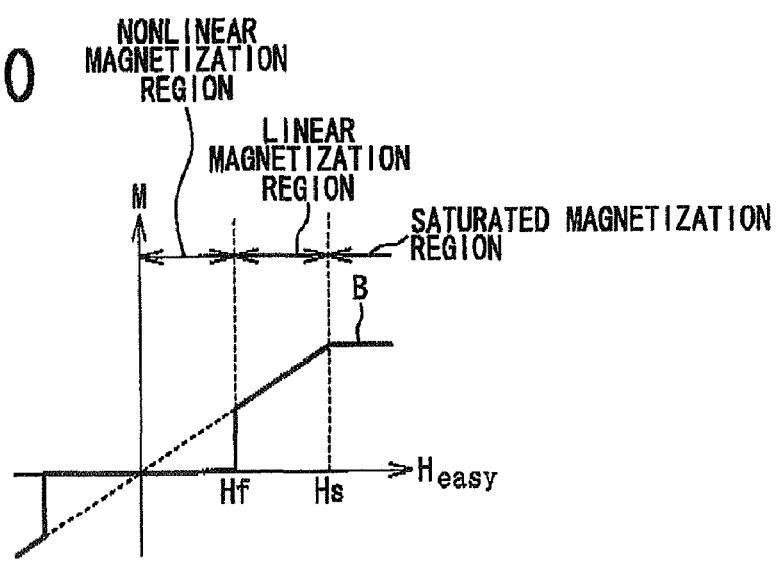
FIG. 10 is a graph showing magnetization characteristics with respect to an external magnetic field $H_{easy}$ in an easy magnetization axis direction.
Figure 11:
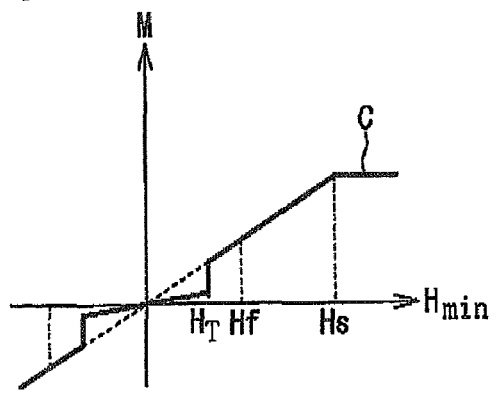
FIG. 11 is a graph showing magnetization characteristics with respect to an external magnetic field $H_{mid}$ in a direction between the hard magnetization axis direction and the easy magnetization axis direction.

FIGS. 9 to 11 are graphs showing magnetization characteristics of the laminated ferrimagnetic structure substance. FIG. 9 shows magnetization characteristics with respect to an external magnetic field $H_{hard}$ in a hard magnetization axis direction. A vertical axis indicates magnetization M, and a horizontal axis indicates the external magnetic field $H_{hard}$ in the hard magnetization axis direction. As shown in a curve A, if the applied external magnetic field $H_{hard}$ is in a range from 0 to Hs (the saturation magnetic field), the laminated ferrimagnetic structure substance 8 has the magnetization M which is lineally changed with respect to the external magnetic field, If the applied external magnetic field $H_{hard}$ is equal to or larger than the Hs, the magnetization M is saturated and made to be constant.

FIG. 10 shows magnetization characteristics with respect to the external magnetic field $H_{easy}$ in the easy magnetization axis direction. A vertical axis indicates the magnetization M, a horizontal axis indicates the external magnetic field $H_{easy}$ in the easy magnetization axis direction. As shown in a curve B, if the applied external magnetic field $H_{easy}$ is in a range from 0 to Hf (the flop magnetic field), the laminated ferrimagnetic structure substance 8 has magnetization M which is substantially 0, because the inside antiferromagnetic coupling is not broken so that it is difficult to induce the magnetization. If the applied external magnetic field $H_{easy}$ is made to be the Hf, the magnetization M is discontinuously increased, Thereafter, if the applied external magnetic field $H_{easy}$ is in a range from the Hf to the Hs, the magnetization M is linearly changed with respect to the external magnetic field, If the applied external magnetic field $H_{easy}$ is equal to or larger than the Hs, the magnetization M is saturated and made to be constant.

FIG. 11 shows magnetization characteristics with respect to an external magnetic field $H_{mid}$ in a direction (or an intermediate direction) between the hard magnetization axis direction and the easy magnetization axis direction. A vertical axis indicates the magnetization M, and a horizontal axis indicates the external magnetic field $H_{mid}$ in the intermediate direction. As shown in a curve C, the laminated ferrimagnetic structure substance 8 shows magnetization characteristics which is a compromise between the magnetization characteristics shown in the curve A in FIG. 9 and the curve B in FIG. 10, If the applied external magnetic field $H_{mid}$ is smaller than the Hf, the laminated ferrimagnetic structure substance 8 has the magnetization M which is induced finely and monotonously with respect to the external magnetic field $H_{mid}$. If the applied external magnetic field $H_{mid}$ reaches a certain threshold value HT (<Hf), the magnetization M is discontinuously increased, and then, the magnetization M changes linearly exceeding the Hf to the Hs with respect to the external magnetic field. If the applied external magnetic field $H_{mid}$ is equal to or larger than the Hs, the magnetization M is saturated and made to be constant.

Here, a low magnetic field region in which magnetization is in a state before exhibiting linear characteristics is called a nonlinear magnetization region. A magnetic field region in which magnetization exhibits linear characteristics is called a linear magnetization region, A high magnetic field region in which the magnetization is saturated is called a saturated magnetization region. Each of the regions is exemplified in FIG. 10. In FIG. 10, the nonlinear magnetization region has the external magnetic field from 0 to the Hf. In FIG. 11, the nonlinear magnetization region has the external magnetic field from 0 to the threshold value HT.

In the nonlinear magnetization region with a low magnetic field to the laminated ferrimagnetic structure substance 8, the laminated ferrimagnetic structure substance 8 has small magnetization. Therefore, the laminated ferrimagnetic structure substance 8 does not apply a magnetic field to the magneto-resistive element 5. Accordingly, a magnetic field generated by the word line 26 and the bit line 27 is not canceled or shielded in the magneto-resistive element 5.

Meanwhile, in the linear magnetization region in which a magnetic field provided for the laminated ferrimagnetic structure substance 8 is equal to or larger than that of the nonlinear magnetization region, the laminated ferrimagnetic structure substance 8 has a large magnetization Therefore, a magnetic filed from the laminated ferrimagnetic structure substance 8 cancels (or shields) the magnetic field generated by the word line 26 and the bit line 27 in the magneto-resistive element 5.

In an example of FIG. 8, if the magnetic field $H_{B\times 2}$ to the laminated ferrimagnetic structure substance 8 is low, the laminated ferrimagnetic structure substance 8 has the magnetization $M_X$ which is small. Therefore, the laminated ferrimagnetic structure substance 8 does not apply the magnetic field $H_{FX}$ to the magneto-resistive element 5. Accordingly, the magnetic field $H_{B\times 1}$ generated by the bit line 27 is not canceled (or shielded) in the magneto-resistive element 5.

Meanwhile, if the magnetic field $H_{B\times 2}$ to the laminated ferrimagnetic structure substance 8 is equal to or larger than the above case, the laminated ferrimagnetic structure substance 8 has the magnetization $M_X$ which is made larger. Therefore, the magnetic field $H_{FX}$ from the laminated ferrimagnetic structure substance 8 cancels (or shields) the magnetic field $H_{B\times 1}$ generated by the bit line 27 in the magneto-resistive element 5.

Figure 12:
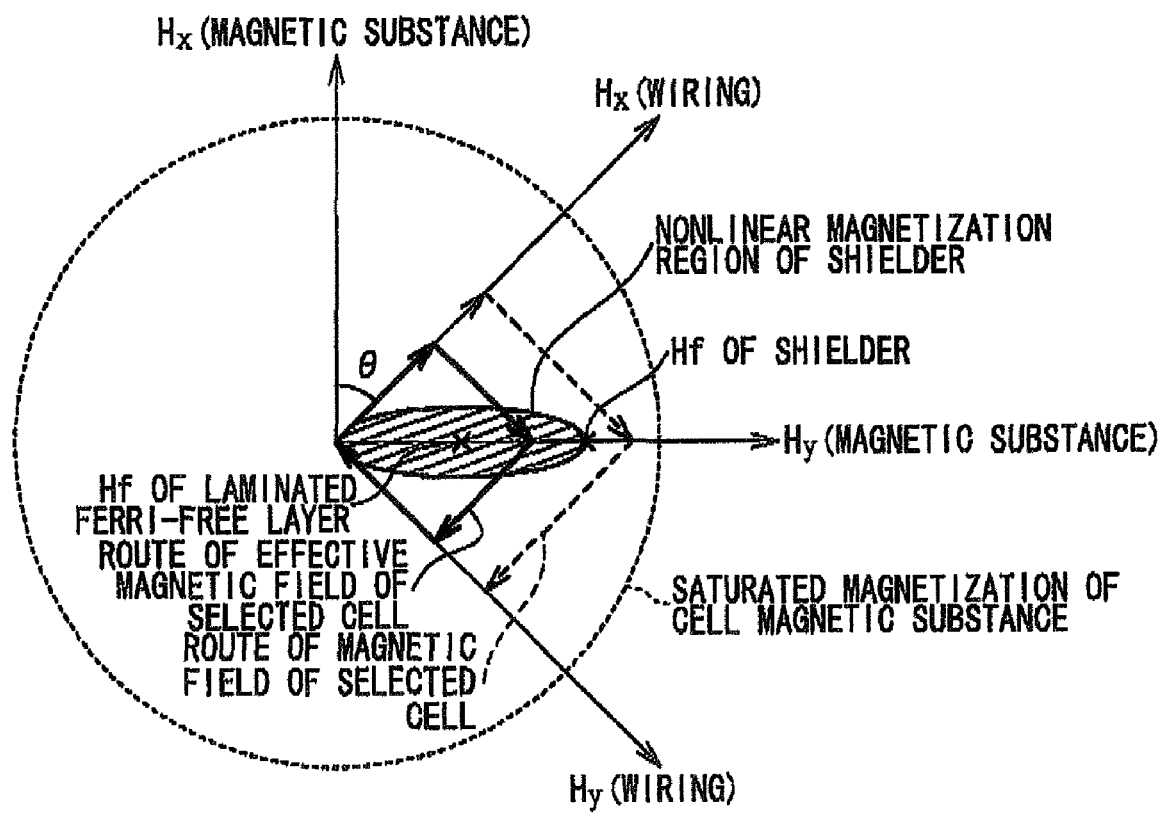
FIG. 12 is a view showing an influence of a laminated ferrimagnetic structure substance (shielder) on a magnetic substance of the memory cell.
Figure 13:
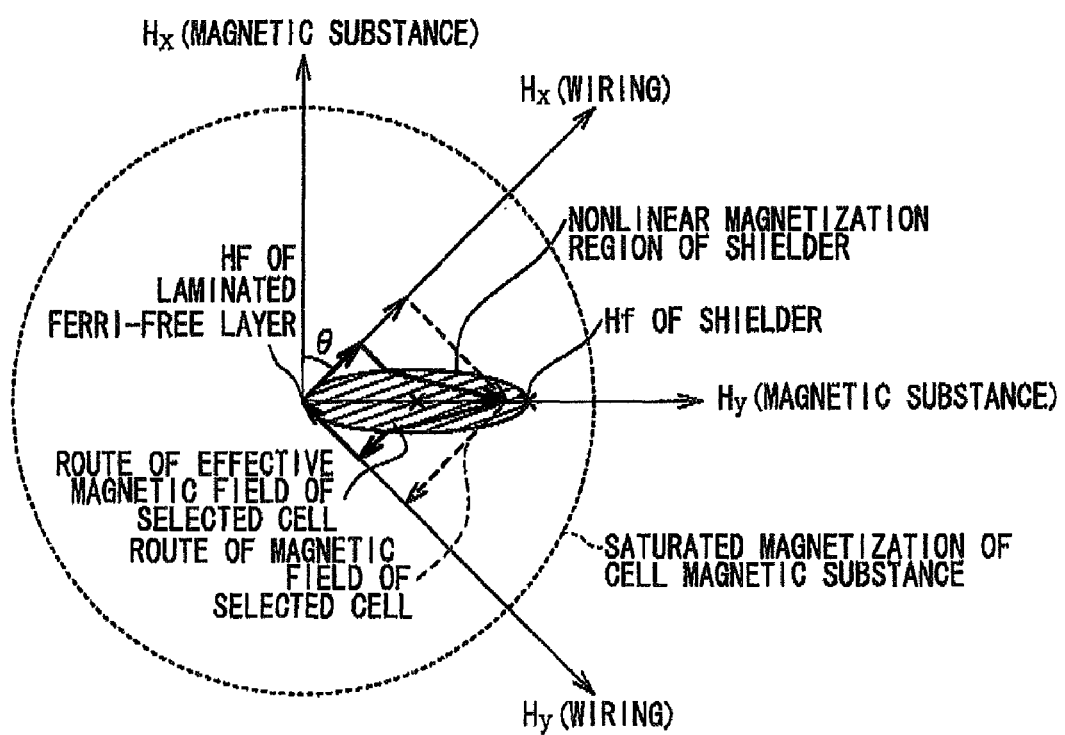
FIG. 13 is a view showing an influence of the laminated ferrimagnetic structure substance (shielder) on the magnetic substance of the memory cell.

FIGS. 12 and 13 are views showing an influence of the laminated ferrimagnetic structure substance (shielder) on a magnetic substance of the memory cell. The magneto-resistive element 5 is inclined to a Y axis by θ. Therefore, magnetic fields $H_X$ (magnetic substance) and $H_Y$ (magnetic substance) of the magneto-resistive element 5 (laminated ferri-free layer 1) in the hard magnetization axis direction and the easy magnetization axis direction are inclined to the magnetic fields $H_X$ (wiring) and $H_Y$ (wiring) of the wirings (word line 26 and bit line 27) in the X axis direction and the Y axis direction by θ. Arrows of broken lines indicate a route of a magnetic field applied to the selected cell. Arrows of solid lines indicate a route of an effective magnetic field applied to the selected cell.

The flop magnetic field Hf of the laminated ferrimagnetic structure substance 8 (shielder) is set to be larger than the flop magnetic field of a cell magnetic substance (laminated ferri-free layer 1), and to be smaller than the (magnetization) saturation magnetic field of the cell magnetic substance. To be more specific, for example, a material of magnetic substances (ferromagnetic layer 17 and ferromagnetic layer 19) and a material of a nonmagnetic substance (nonmagnetic layer 18) that form a laminated ferrimagnetic structure in the laminated ferrimagnetic structure substance 8 are assumed to be the same as those of the laminated ferri-free layer 1 respectively. Here, a film thickness of the ferromagnetic layer 17 and the ferromagnetic layer 19 is assumed to have the same value as a film thickness of the ferromagnetic layer 11 and the ferromagnetic layer 13 in the laminated ferri-free layer 1. Simultaneously, a film thickness of the nonmagnetic layer 18 is assumed to have a different value from a film thickness of the nonmagnetic layer 12 in the laminated ferri-free layer 1. Therefore, an antiferromagnetic coupling is strengthened among the ferromagnetic layers.

Figure 19:
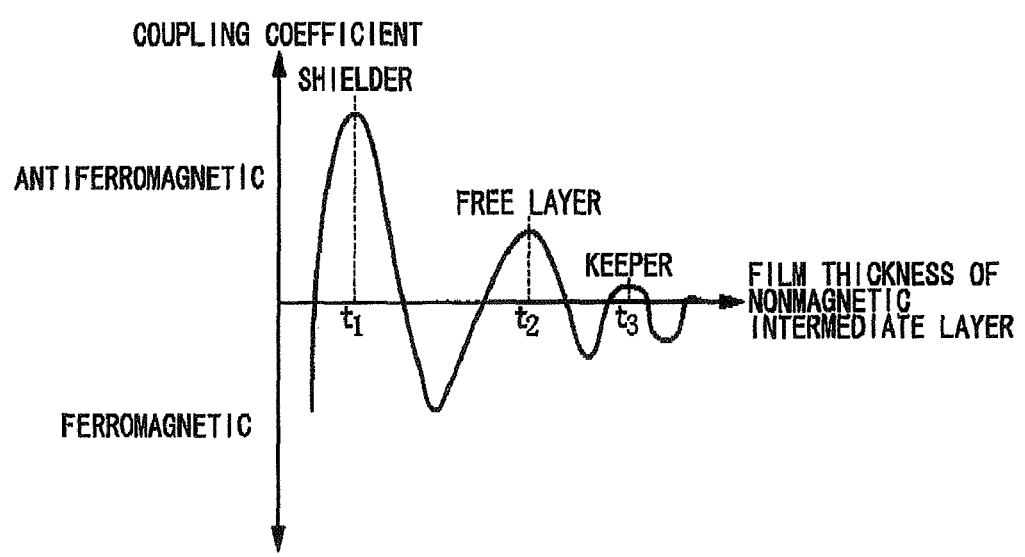
FIG. 19 is a graph showing a relationship between a film thickness of a nonmagnetic intermediate layer and a coupling coefficient among ferromagnetic layers in the laminated ferrimagnetic structure.

A method to strengthen an antiferromagnetic coupling among the ferromagnetic layers is as follows. FIG. 19 is a graph showing a relationship between a film thickness of a nonmagnetic intermediate layer (or a nonmagnetic layer) and a coupling coefficient among ferromagnetic layers in the laminated ferrimagnetic structure. A vertical axis indicates the coupling coefficient which is defined to be positive if ferromagnetic layers are antiferromagnetically coupled from each other. A horizontal axis indicates a film thickness of a nonmagnetic intermediate layer. The coupling coefficient fluctuates while attenuating between a ferromagnetic state and an antiferromagnetic state depending on a film thickness of a nonmagnetic intermediate layer (the nonmagnetic layer 18 and the nonmagnetic layer 12). In the case of FIGS. 12 and 13, it is assumed that a film thickness of the nonmagnetic layer 18 of the laminated ferrimagnetic structure substance 8 (shielder) is t1 and a film thickness of the nonmagnetic layer 12 of the laminated ferri-free layer 1 is t2 as shown in FIG. 19. Therefore, an antiferromagnetic coupling among the ferromagnetic layers of the laminated ferrimagnetic structure substance 8 can be made stronger than that of the laminated ferri-free layer 1.

As described above, the ferromagnetic layers are made to have the same material and film thickness, and the nonmagnetic layers are made to have the same material while the nonmagnetic layers are exclusively made to have the film thicknesses as shown in FIG. 19, so that the flop magnetic field Hf of the laminated ferrimagnetic structure substance 8 (shielder) can be securely made larger than the flop magnetic field of the cell magnetic substance (the laminated ferri-free layer 1). In addition, conditions of an existing process can be partially changed and repeated without introducing a new process, which allows stable manufacturing.

The present invention is not limited to the above case, and the laminated ferri-free layer 1 and the shielder may be designed so that the flop magnetic field Hf of the laminated ferrimagnetic structure substance 8 (shielder) is securely made larger than the flop magnetic field of the cell magnetic substance (the laminated ferri-free layer 1).

Referring to FIG. 12, if a magnetic field in the outside of a nonlinear magnetization region of the laminated ferrimagnetic structure substance 8 (shielder) is applied, the laminated ferrimagnetic structure substance 8 is magnetized. Therefore, the magnetic field applied to the memory cell is weakened or shielded as shown in FIG. 8, so that an effective magnetic field applied to the memory cell is made smaller. Meanwhile, referring to FIG. 13, if a magnetic field smaller than the flop magnetic field Hf of the laminated ferrimagnetic structure substance 8 (shielder) is applied, the laminated ferrimagnetic structure substance 8 is hardly magnetized. Therefore, the effective magnetic field applied to the memory cell is not shielded. For example, the laminated ferrimagnetic structure substance 8 has magnetization which is completely 0 on the Hy (magnetic substance) axis, i.e. on the easy magnetization axis of the magnetic substance, so that "a route of the magnetic field of the selected cell" is consistent with "a route of the effective magnetic field of the selected cell". Meanwhile, in the outside of the nonlinear magnetization region, the magnetic field is shielded in the similar ratio with the case of FIG. 12. In the inside of the nonlinear magnetization region, the magnetic field is shielded in an intermediate state between magnetization of 0 and a normal magnetization.

In the present invention, even if the magnetic field which is larger than the flop magnetic field Hf of the laminated ferrimagnetic structure substance 8 (shielder) is provided for the magneto-resistive element 5, "the route of the effective magnetic field of the selected cell" does not approach the saturation magnetic field of the cell magnetic substance. Meanwhile, even if the magnetic field which is smaller than the flop magnetic field Hf of the laminated ferrimagnetic structure substance 8 is provided, a design can be achieved so as to allow "the route of the effective magnetic field of the selected cell" to pass through the outside of the flop magnetic field Hf of the laminated ferri-free layer 1. Due to these effects, a margin of the magnetic field which can be applied to the cell magnetic substance is expanded without approaching the saturation magnetic field in the cell magnetic substance (magnetic substance of the laminated ferri-free layer 1). Therefore, a margin of a current which is made to flow in the word line 26 and the bit line 27 can be expanded. In addition, a wrong operation caused by the thermal disturbance can be prevented. As a result, enhancement of manufacturing yields and reliability of the MRAM can be realized.

Next, an operation, which includes a read operation and a write operation in the first embodiment of the MRAM to which the memory cell was applied according to the present invention, will be explained.

Data is read from the memory cell 10 as follows. A suffix s means to be selected.

A constant current is provided by the read current load circuit 43 for the magneto-resistive element 5 of the selected cell 10s which corresponds to a cross point between the selected read word line 25s selected by the X-side selector 38 and the selected bit line 27s selected by the Y-side selector. The selected bit line 27s is made to be a voltage corresponding to a state of the laminated ferri-free layer 1 of the magneto-resistive element 5. Meanwhile, a constant current is also provided for the reference cell 10r selected by the bit line 27r and the selected read word line 25s similarly. The bit line 27r is made to be a predetermined reference voltage. The sense amplifier 115 determines data of the selected cell 10s by comparing the value of the both voltages. For example, if a voltage of the selected bit line 27s is larger than a reference voltage, data is determined as 1, and data is determined as 0 if it is smaller. It will be described below to write data into the memory cell 10.

Data is written into the memory cell 10 as follows. A suffix s means to be selected.

The read operation is performed for the magneto-resistive element 5 of the selected cell 10s which corresponds to a cross point between the selected write word line 26s selected by the X-side selector 38 and the selected bit line 27s selected by the Y-side selector. If the read data is a data to write, the write operation is finished. If the read data is not the data to write, one of the write current $I_{BL}$ and the write current $I_{WL}$ is made to flow first in accordance with the data (one of "1" and "0") to write, and the other is made to flow later with a predetermined time interval. Thereafter, the current which was made to flow first is suspended, followed by suspending the current which was made to flow later. Therefore, a magnetization direction of the magneto-resistive element 5 is rotated so as to correspond to the data to write (one of "1" and "0"), and data is written.

According to the present invention, composite magnetization in the laminated ferri-free layer 1 of the memory cell can be prevented from approaching saturated magnetization by a write magnetic field provided by a current of the word line 26 and the bit line 27. Therefore, a possibility of switching between magnetization of the ferromagnetic layer 11 in the upper layer and magnetization of the ferromagnetic layer 13 in the lower layer caused by the thermal disturbance can be suppressed. Moreover, it is possible to further enhance the reliability and the manufacturing yields of the memory cell and the magnetic random access memory, and cost reduction of the magnetic random access memory can be realized.

Second Embodiment

A second embodiment of the memory cell and the magnetic random access memory (MRAM) according to the present invention will be explained referring to accompanying drawings.

First, a configuration of the second embodiment of the MRAM, to which the memory cell is applied according to the present invention, will be explained. FIG. 5 is a block diagram showing the configuration of the second embodiment of the MRAM to which the memory cell is applied according to the present invention. Since it is the same as the configuration of the first embodiment, explanation will be omitted.

Figure 14:
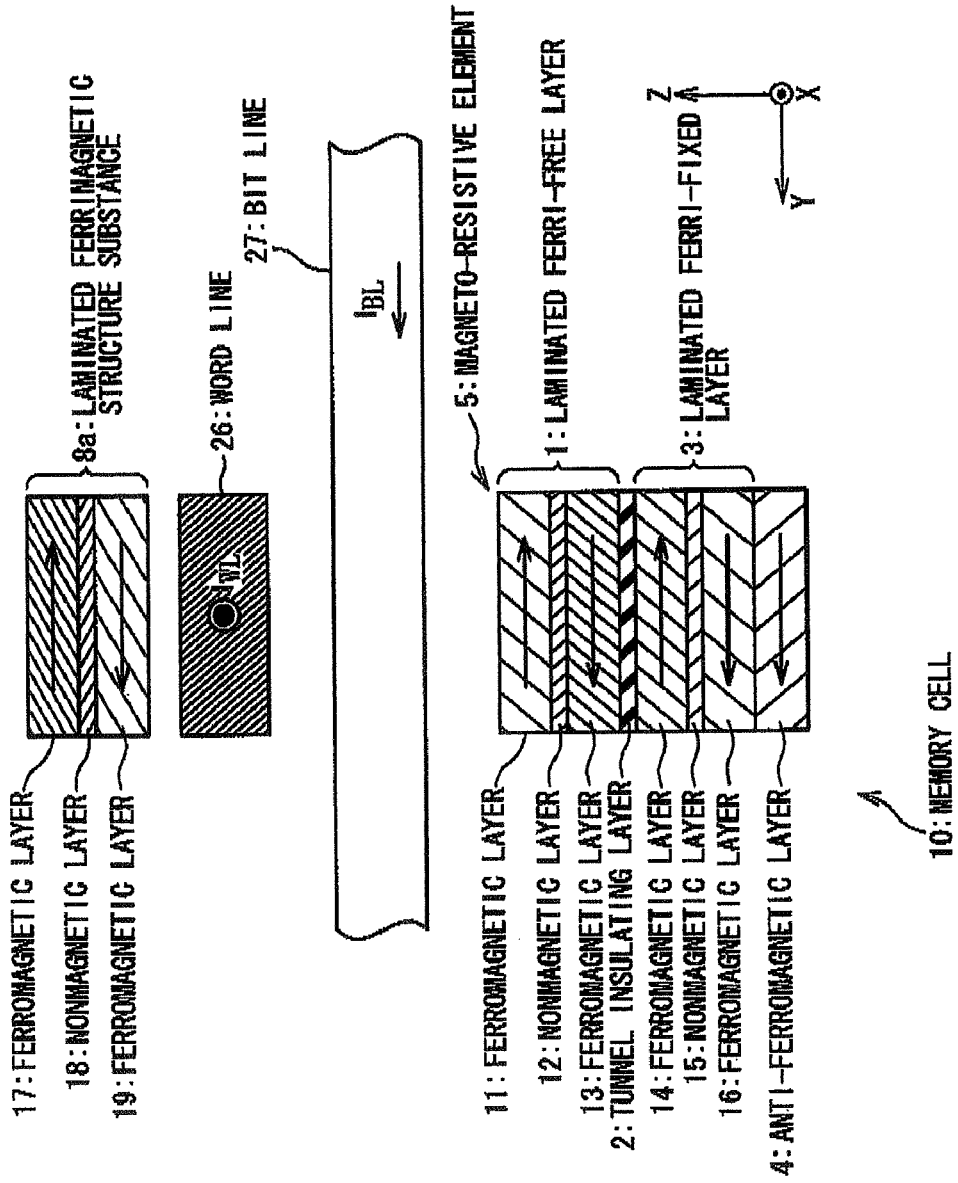
FIG. 14 is a sectional view showing the vicinity of the memory cell in the MRAM of FIG. 5.

FIG. 14 is a sectional view of the vicinity of the memory cell in the MAMA of FIG. 5. Since the magneto-resistive element 5 of the memory cell 10 is similar to that of the first embodiment, explanation thereof will be omitted, The magneto-resistive element 5 is provided in one side of the write word line 26 and the bit line 27 that are substantially orthogonal from each other via an interlayer insulating layer (not shown)

Meanwhile, a laminated ferrimagnetic structure substance 8a (hereinafter, also referred to as a keeper) is provided in the other side of the write word line 26 and the bit line 27 via an interlayer insulating layer (not shown) The laminated ferrimagnetic structure substance 8a includes a laminated ferri structure (or a laminated ferrimagnetic structure), in which the ferromagnetic layer 19, the nonmagnetic layer 18 and the ferromagnetic layer 17 are laminated in this order.

Figure 15:
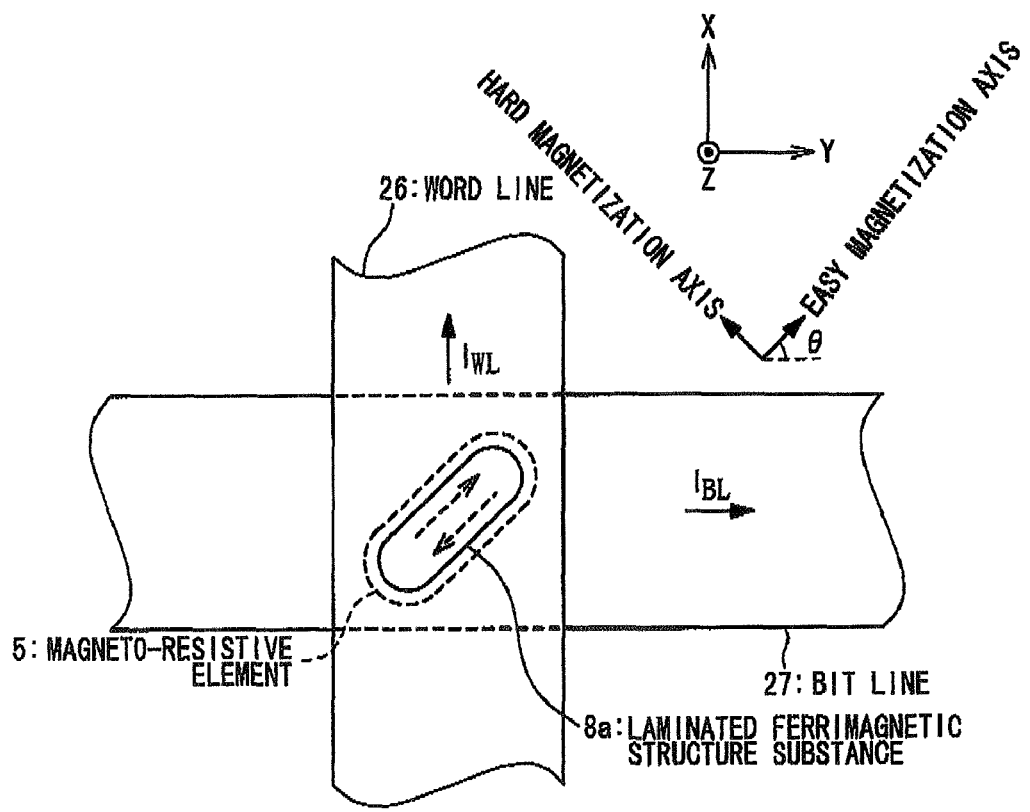
FIG. 15 is an upper surface view showing the structure of the MRAM according to the present invention.

FIG. 15 is an upper surface view showing a structure of the MRAM according to the present invention. The magneto-resistive element 5 has the easy magnetization axis which is directed at substantially 45 degrees (θ) with respect to the word line 26 and the bit line 27. It is due to consideration for easiness of the toggle operation. The laminated ferrimagnetic structure substance 8a on the magneto-resistive element 5 has a sectional structure which is substantially the same as that of the magneto-resistive element 5 when it is seen from a top surface. It is preferable in the enhancement of the magnetic effect with respect to the magneto-resistive element 5.

Figure 16:
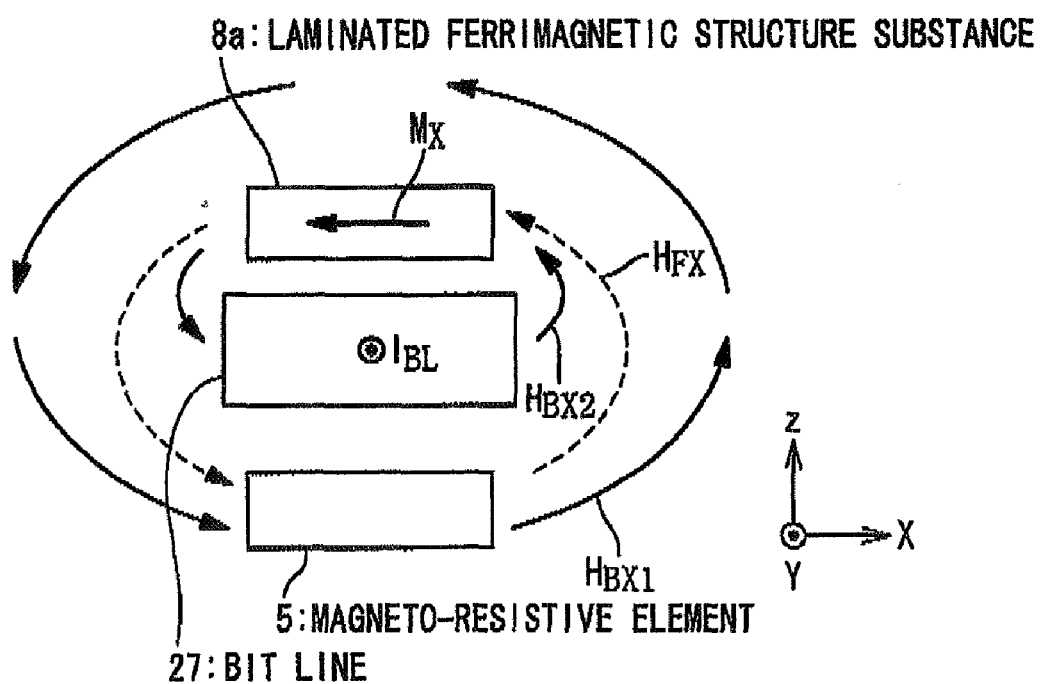
FIG. 16 is a view exemplifying a state of a magnetic field which acts on the magneto-resistive element 5.

FIG. 16 is a view exemplifying a state of a magnetic field which acts on the magneto-resistive element 5. The laminated ferrimagnetic structure substance 8a is placed in an opposite direction (or an opposite side) of the magneto-resistive element 5 with respect to the bit line 27 and the word line 26 (refer to FIG. 14) The laminated ferrimagnetic structure substance 8a acts to strengthen the magnetic field applied to the magneto-resistive element 5 when the current $I_{BL}$ flowing in the bit line 27 and the current $I_{WL}$ flowing in the word line 26 are made to flow at the time of the write operation.

As shown in FIG. 16, the current $I_{BL}$ flowing in the bit line 27 in the +Y direction causes the magnetic field $H_{B\times1}$ in the +X direction to be applied to the magneto-resistive element 5. Furthermore, the current $I_{BL}$ causes the magnetic field $H_{B\times2}$ in a −X direction to be applied to the laminated ferrimagnetic structure substance 8a which is provided corresponding to the magneto-resistive element 5. Due to the application of the magnetic field $H_{B\times2}$ the magnetization $M_X$ is induced in the −X direction in the laminated ferrimagnetic structure substance Ba. The magnetization $M_X$ induced in the laminated ferrimagnetic structure substance 8a causes the magnetic field $H_{FX}$ to be applied to the magneto-resistive element 5. If the magneto-resistive element 5 and the laminated ferrimagnetic structure substance 8a are placed in an opposite side of the bit line 27, the magnetic field $H_{FX}$ is placed in the same +X direction as the magnetic field $H_{B\times1}$ Accordingly, the laminated ferrimagnetic structure substance 8a acts to strengthen the magnetic field applied to the magneto-resistive element 5 when the current $I_{BL}$ is made to flow in the bit line 27. According to similar consideration, it is understood that the laminated ferrimagnetic structure substance 8a acts to strengthen the magnetic field applied to the magneto-resistive element 5 when the current $I_{WL}$ is made to flow in the word line 26.

Figure 17:
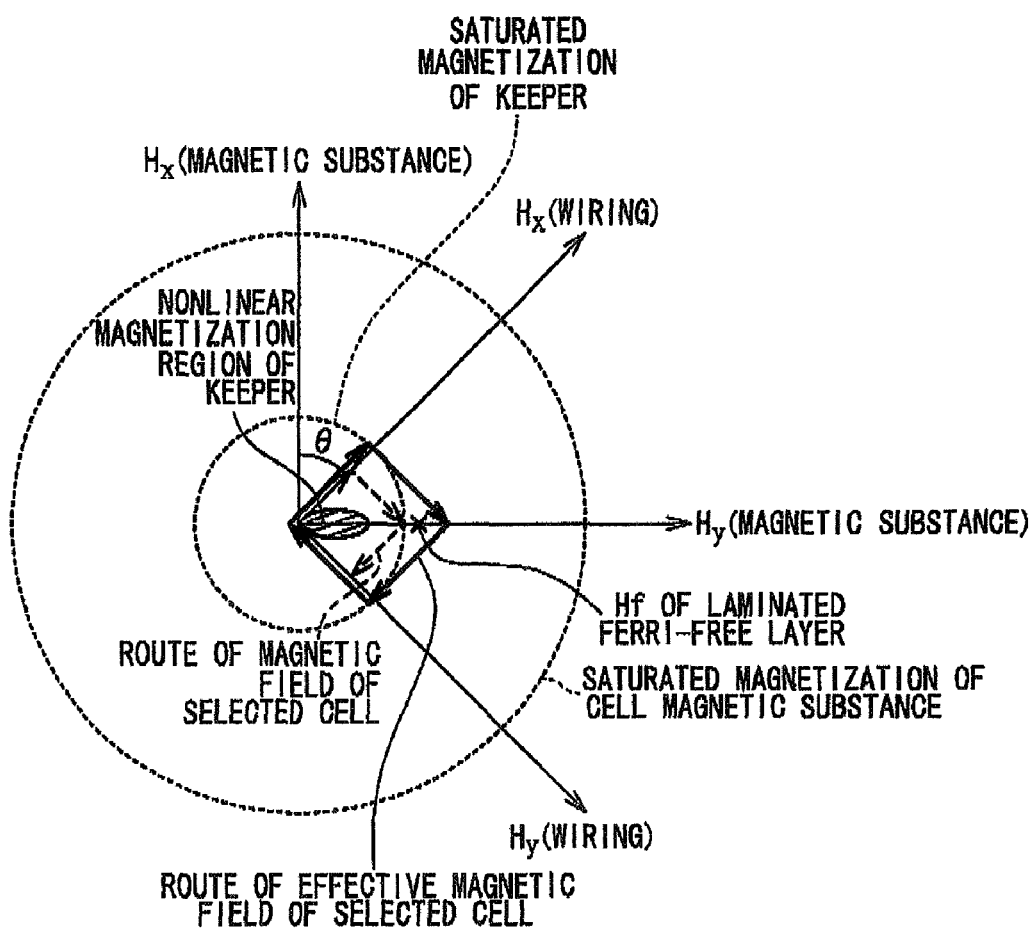
FIG. 17 is a view showing an influence of a laminated ferrimagnetic structure substance (keeper) on the magnetic substance of the memory cell.
Figure 18:
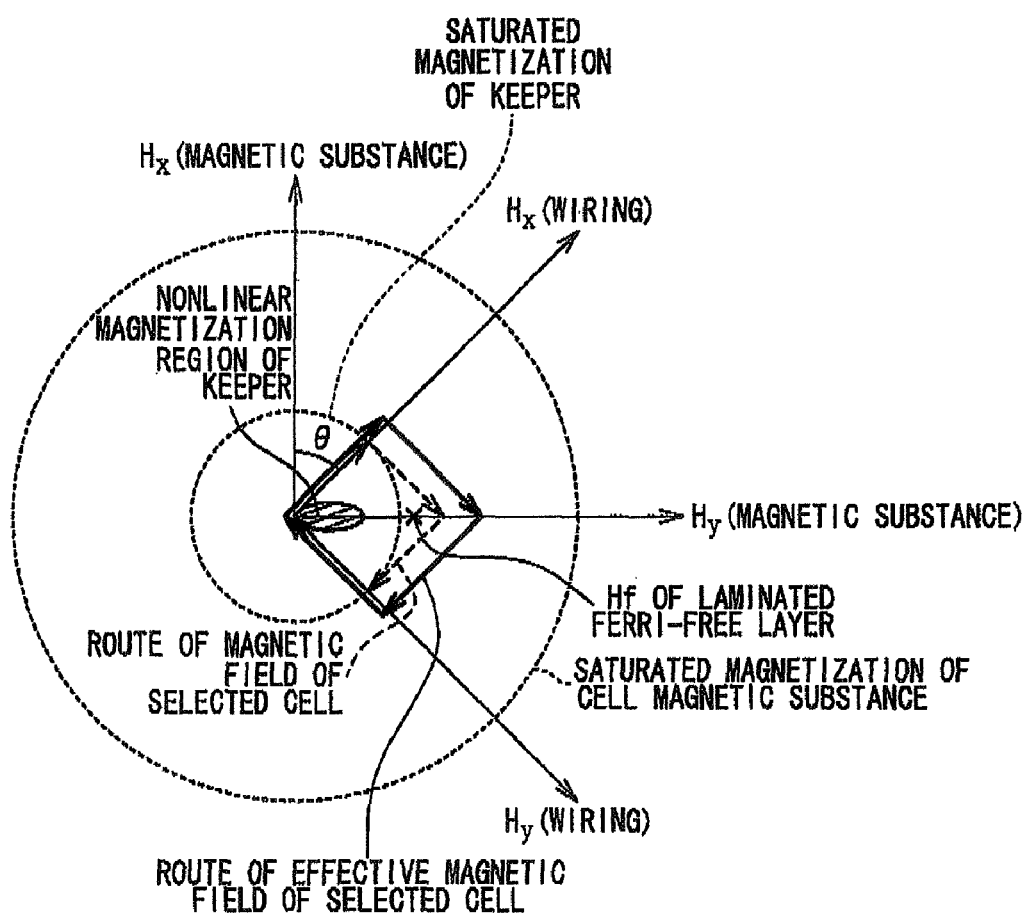
FIG. 18 is a view showing an influence of the laminated ferrimagnetic structure substance (keeper) on the magnetic substance of the memory cell.

Since magnetization characteristics of the laminated ferrimagnetic structure substance Ba are as explained in FIGS. 9 to 11 in the first embodiment, explanation thereof will be omitted, FIGS. 17 and 18 are views showing an influence of the laminated ferrimagnetic structure (keeper) on a magnetic substance of the memory cell. The magneto-resistive element 5 is inclined to the Y axis by θ. Therefore, the magnetic fields $H_X$ (magnetic substance) and $H_Y$ (magnetic substance) of the magneto-resistive element 5 (laminated ferri-free layer 1) in the hard magnetization axis direction and the easy magnetization axis direction are inclined to the magnetic fields $H_X$ (wiring) and $H_Y$ (wiring) of the wirings (word line 26 and bit line 27) in the X axis direction and the Y axis direction by θ. Arrows of broken lines indicate a route of the magnetic field applied to the selected cell. Arrows of solid lines indicate a route of the effective magnetic field applied to the selected cell.

In this case, the (magnetization) saturation magnetic field of the laminated ferrimagnetic structure substance 8a (keeper) is set to be sufficiently smaller than the (magnetization) saturation magnetic field of the cell magnetic substance (laminated ferri-free layer 1) as shown in FIGS. 17 and 18. To be more specific, a material of magnetic substances (ferromagnetic layer 17 and ferromagnetic layer 19) and a material of a nonmagnetic substance (nonmagnetic layer 18) that form a laminated ferrimagnetic structure in the laminated ferrimagnetic structure substance 8a are assumed to be the same as those of the laminated ferri-free layer 1, respectively. Here, a film thickness of the ferromagnetic layer 17 and the ferromagnetic layer 19 is assumed to have the same value as a film thickness of the ferromagnetic layer 11 and the ferromagnetic layer 13 in the laminated ferri-free layer 1. Simultaneously, a film thickness of the nonmagnetic layer 18 is assumed to have a different value from a film thickness of the nonmagnetic layer 12 in the laminated ferri-free layer 1. Therefore, the antiferromagnetic coupling is weakened among the ferromagnetic layers.

A method to weaken the antiferromagnetic coupling among the ferromagnetic layers is as follows. Referring to FIG. 19, in the case of FIGS. 17 and 18, it is assumed that a film thickness of the nonmagnetic layer 18 of the laminated ferrimagnetic structure substance 8a (keeper) is t3 and a film thickness of the nonmagnetic layer 12 of the laminated ferri-free layer 1 is t2. Therefore, the antiferromagnetic coupling between the ferromagnetic layers in the laminated ferrimagnetic structure substance 8a can be made weaker than that of the laminated ferri-free layer 1.

As described above, the ferromagnetic layers are made to have the same material and film thickness, and the nonmagnetic layers are made to have the same material while the nonmagnetic layers are exclusively made to have the film thicknesses as shown in FIG. 19, so that the flop magnetic field Hf of the laminated ferrimagnetic structure substance 8a (keeper) can be securely made smaller than the flop magnetic field of the cell magnetic substance (the laminated ferri-free layer 1). In addition, conditions of an existing process can be partially changed and repeated without introducing a new process, which allows stable manufacturing.

The present invention is not limited to the above case, and the laminated ferri-free layer 1 and the keeper may be designed so that the flop magnetic field Hf of the laminated ferrimagnetic structure substance 8a (keeper) is securely made smaller than the flop magnetic field of the cell magnetic substance (the laminated ferri-free layer 1).

Referring to FIG. 17, if a magnetic field equal to or smaller than the saturation magnetic field is applied to the laminated ferrimagnetic structure substance 8a (keeper), the laminated ferrimagnetic structure substance 8a is magnetized. Therefore, the magnetic field applied to the memory cell is strengthened as shown in FIG. 16, so that the effective magnetic field applied to the memory cell is made larger. Meanwhile, referring to FIG. 18, if a magnetic field larger than the saturation magnetic field of the laminated ferrimagnetic structure substance 8a (keeper) is applied, the laminated ferrimagnetic structure substance 8a is not magnetized to be a state equal to or larger than a state of the saturation magnetic field. Therefore, the effective magnetic field applied to the memory cell is not made stronger than a magnetic field in the saturation magnetic field. In the case of an example of FIG. 18, the difference between "the route of the magnetic field of the selected cell" and "the route of the effective magnetic field of the selected cell" is due to an influence of the existence of the keeper, and the influence of the keeper is proportional to "the route of the magnetic field of the selected cell" if the magnetic field is not saturated, so that "the route of the effective magnetic field of the selected cell" is assumed to pass through a further outer side (where there is no operational margin). However, this influence is saturated due to saturated magnetization of the keeper, which results in substantially the same as the case of FIG. 17.

In the present invention, even if the magnetic field which is smaller than the saturation magnetic field of the laminated ferrimagnetic structure substance 8a (keeper) is provided for the magneto-resistive element 5, a design can be achieved so as to allow "the route of the effective magnetic field of the selected cell" to pass through the outside of the flop magnetic field Hf of the laminated ferri-free layer 1. Meanwhile, even if the magnetic field which is larger than the saturation magnetic field of the laminated ferrimagnetic structure substance 8a (keeper) is provided, "the route of the effective magnetic field of the selected cell" does not approach the saturation magnetic field of the cell magnetic substance. Due to these effects, a margin of the magnetic field which can be applied to the cell magnetic substance is expanded without approaching the saturation magnetic field in the cell magnetic substance (the magnetic substance of the laminated ferri-tree layer 1). Therefore, a margin of a current which is made to flow in the word line 26 and the bit line 27 can be expanded. In addition, a wrong operation caused by the thermal disturbance can be prevented. As a result, the enhancement of manufacturing yields and reliability of the MRAM can be realized.

Since an operation of the second embodiment of the MRAM to which the memo cell is applied according to the present invention is similar to that of the first embodiment, explanation thereof will be omitted.

According to the present invention, the composite magnetization in the laminated ferri-free layer 1 of the memory cell can be prevented from approaching the saturated magnetization by the write magnetic field provided by the current of the word line 26 and the bit line 27. Therefore, the possibility of switching between the magnetization of the ferromagnetic layer 11 in the upper layer and the magnetization of the ferromagnetic layer 13 in the lower layer caused by the thermal disturbance can be suppressed. Moreover, it is possible to further enhance the reliability and the manufacturing yields of the memory cell and the magnetic random access memory, and cost reduction of the magnetic random access memory can be realized.

The present invention is not limited to the above respective embodiments, and it is apparent that the respective embodiments can be appropriately modified within a scope of technical ideas of the present invention.

The invention claimed is:

1. A memory cell comprising:
   a magneto-resistive element that comprises:
      a free layer which has a laminated ferrimagnetic structure,
      a fixed layer, and
      a nonmagnetic layer which is interposed between said free layer and said fixed layer; and
   a laminated ferrimagnetic structure substance which corresponds to said magneto-resistive element, and is arranged to have a distance of a predetermined range from said magneto-resistive element, said laminated ferrimagnetic structure substance having a laminated ferrimagnetic structure,
   wherein a flop magnetic field of said laminated ferrimagnetic structure substance is larger than said flop magnetic field of said free layer; and
   wherein the predetermined range between the laminated ferrimagnetic structure substance and the magneto-resistive element is such the laminated ferrimagnetic structure substance is not magnetically coupled to the free layer of the magneto-resistive element.

2. The memory cell according to claim 1, wherein a data is written into said magneto-resistive element by a magnetic field larger than a flop magnetic field of said free layer.

3. The memory cell according to claim 1, wherein said laminated ferrimagnetic structure substance is placed in the same direction as said free layer with respect to a first wiring and a second wiring.

4. The memory cell according to claim 3, wherein said flop magnetic field of said laminated ferrimagnetic structure substance is smaller than a saturation magnetic field of said free layer.

5. The memory cell according to claim 3, wherein said free layer includes:
   a first magnetic layer which is formed by a ferromagnetic substance,
   a second magnetic layer which is formed by a ferromagnetic substance, and
   a first nonmagnetic layer which is interposed between said first magnetic layer and said second magnetic layer, and has a film thickness so as to antiferromagnetically couple said first magnetic layer and said second magnetic layer,
   wherein said laminated ferrimagnetic structure substance includes:
   a third magnetic layer which is formed by said ferromagnetic substance,
   a fourth magnetic layer which is formed by said ferromagnetic substance, and
   a second nonmagnetic layer which is interposed between said third magnetic layer and said fourth magnetic layer, and has a film thickness so as to antiferromagnetically couple said third magnetic layer and said fourth magnetic layer,
   wherein same materials are used in configurations between said first magnetic layer and said third magnetic layer, between said second magnetic layer and said fourth magnetic layer, and between said first nonmagnetic layer and said second nonmagnetic layer, respectively.

6. The memory cell according to claim 5, wherein a film thickness of said first nonmagnetic layer is larger than a film thickness of said second nonmagnetic layer.

7. The memory cell according to claim 5, wherein the film thickness of said first nonmagnetic layer is different from the film thickness of said second nonmagnetic layer.

8. The memory cell according to claim 1, wherein a magnetization direction of said laminated ferrimagnetic structure substance is not fixed.

9. A magnetic random access memory comprising:
   a plurality of first wirings which extend in a first direction;
   a plurality of second wirings which extend in a second direction substantially perpendicular to said first direction; and
   a plurality of memory cells which are placed corresponding to positions where said plurality of first wirings intersect with said plurality of second wirings, respectively,
   wherein each of said plurality of memory cells includes:
   a magneto-resistive element, and
   a laminated ferrimagnetic structure substance which is arranged to have a distance of a predetermined range from said magneto-resistive element, and has a laminated ferrimagnetic structure,
   wherein said magneto-resistive element includes:
   a free layer which has a laminated ferrimagnetic structure,
   a fixed layer, and
   a nonmagnetic layer which is interposed between said free layer and said fixed layer,
   wherein said magneto-resistive element has an easy magnetization axis direction which is different from said first direction and said second direction; and wherein a flop magnetic field of said laminated ferrimagnetic structure substance is larger than a flop magnetic field of said free layer; and wherein the predetermined range between the laminated ferrimagnetic structure substance and the magneto-resistive element is such the laminated ferrimagnetic structure substance is not magnetically coupled to the free layer of the magneto-resistive element.

10. The magnetic random access memory according to claim 9, wherein a data is written into said magneto-resistive element by a magnetic field larger than a flop magnetic field of said free layer.

11. The magnetic random access memory according to claim 9, wherein said laminated ferrimagnetic structure substance is placed in the same direction as said free layer with respect to said first wiring and said second wiring.

12. The magnetic random access memory according to claim 11, wherein said flop magnetic field of said laminated ferrimagnetic structure substance is smaller than a saturation magnetic field of said free layer.

13. The memory cell according to claim 11, wherein said free layer includes:
    a first magnetic layer which is formed by a ferromagnetic substance,
    a second magnetic layer which is formed by a ferromagnetic substance, and
    a first nonmagnetic layer which is interposed between said first magnetic layer and said second magnetic layer, and has a film thickness so as to antiferromagnetically couple said first magnetic layer and said second magnetic layer,
    wherein said laminated ferrimagnetic structure substance includes:
    a third magnetic layer which is formed by said ferromagnetic substance,
    a fourth magnetic layer which is formed by said ferromagnetic substance, and
    a second nonmagnetic layer which is interposed between said third magnetic layer and said fourth magnetic layer, and has a film thickness so as to antiferromagnetically couple said third magnetic layer and said fourth magnetic layer,
    wherein same materials are used in configurations between said first magnetic layer and said third magnetic layer, between said second magnetic layer and said fourth magnetic layer, and between said first nonmagnetic layer and said second nonmagnetic layer, respectively.

14. The magnetic random access memory according to claim 13, wherein a film thickness of said first nonmagnetic layer is larger than a film thickness of said second nonmagnetic layer.

15. The magnetic random access memory according to claim 13, wherein the film thickness of said first nonmagnetic layer is different from the film thickness of said second nonmagnetic layer.

16. The magnetic random access memory according to claim 13, wherein a magnetization direction of said laminated ferromagnetic structure substance is not fixed.

17. A memory cell comprising:
    a magneto-resistive element, the magneto-resistive element comprising:
        a free layer which has a laminated ferrimagnetic structure,
        a fixed layer, and
        a nonmagnetic layer which is interposed between the free layer and the fixed layer; and
    a laminated ferrimagnetic structure substance which corresponds to the magneto-resistive element,
    wherein the laminated ferrimagnetic structure substance is arranged so as not to be magnetically coupled to the free layer of the magneto-resistive element, and wherein the laminated ferrimagnetic structure substance has a laminated ferrimagnetic structure.

18. The memory cell according to claim 17, wherein the magneto-resistive element is not coupled to the laminated ferromagnetic structure substance when spaced apart from the laminated ferromagnetic structure substance by a predetermined distance.

19. A magnetic random access memory comprising:
    a plurality of first wirings which extend in a first direction;
    a plurality of second wirings which extend in a second direction substantially perpendicular to said first direction; and
    a plurality of memory cells which are placed corresponding to positions where said plurality of first wirings intersect with said plurality of second wirings, respectively,
    wherein each of said plurality of memory cells includes:
        a magneto-resistive element, and
        a laminated ferrimagnetic structure substance, wherein the laminated ferrimagnetic structure substance is arranged so as not to be magnetically coupled to the free layer of the magneto-resistive element, and said laminated ferrimagnetic structure substance has a laminated ferrimagnetic structure; and
    wherein said magneto-resistive element includes:
        a free layer which has a laminated ferrimagnetic structure,
        a fixed layer, and
        a nonmagnetic layer which is interposed between said free layer and said fixed layer; and
    wherein said magneto-resistive element has an easy magnetization axis direction which is different from said first direction and said second direction.

\* \* \* \* \*